United States Patent [19]

Shin et al.

[11] Patent Number: 5,498,932

[45] Date of Patent: Mar. 12, 1996

[54] DRIVE VOLTAGE GENERATING CIRCUIT HAVING A CONTRAST CONTROL FUNCTION

[75] Inventors: Yasuhiro Shin; Takashi Hamamoto, both of Tokyo, Japan

[73] Assignee: OKI Electric Industry Co., Ltd., Tokyo, Japan

[21] Appl. No.: 297,120

[22] Filed: Aug. 29, 1994

[30] Foreign Application Priority Data

Sep. 3, 1993 [JP] Japan .................................. 5-219858

[51] Int. Cl.⁶ ..................................................... G09G 3/10
[52] U.S. Cl. ...................... 315/169.3; 315/169.1; 345/76; 345/211
[58] Field of Search ........................... 315/169.3, 169.2, 315/169.4, 169.1; 340/781, 784, 765, 811; 359/55, 84

[56] References Cited

U.S. PATENT DOCUMENTS

| | | | |
|---|---|---|---|
| 4,646,079 | 2/1987 | Kitai et al. | 315/169.3 |
| 5,119,097 | 6/1992 | Ohkura et al. | 341/158 |
| 5,336,978 | 8/1994 | Alessio | 315/169.3 |

FOREIGN PATENT DOCUMENTS

| | | |
|---|---|---|
| 0479304 | 4/1992 | European Pat. Off. . |
| 4009404 | 9/1991 | Germany . |
| 5-257120 | 10/1993 | Japan . |

Primary Examiner—Robert J. Pascal
Assistant Examiner—Reginald A. Ratliff
Attorney, Agent, or Firm—Steven M. Rabin

[57] ABSTRACT

A drive voltage generating circuit outputs drive signals having voltage levels which is controlled by a second control signal is disclosed. A drive voltage generating circuit according to the present invention comprises drive output terminals for outputting drive signals having voltage levels, a bias circuit having a first voltage terminal to be applied to a first voltage and a second voltage terminal to be applied to a second voltage. The bias circuit produces voltage signals having the drive voltage levels. A drive voltage generating circuit according to the present invention further comprises a switching circuit having input terminals coupled to the bias circuit, output terminals coupled to the drive output terminals and a control terminal receiving a first control signal, a bias potential control circuit coupled between the second voltage terminal and a third voltage terminal to be applied to a third voltage. The bias potential control circuit includes a first voltage control circuit controlling a resistance value between the second and third voltage terminals in response to contrast data signals and a second voltage control circuit controlling the resistance value between the second and third voltage terminals in response to a second control signal.

22 Claims, 15 Drawing Sheets

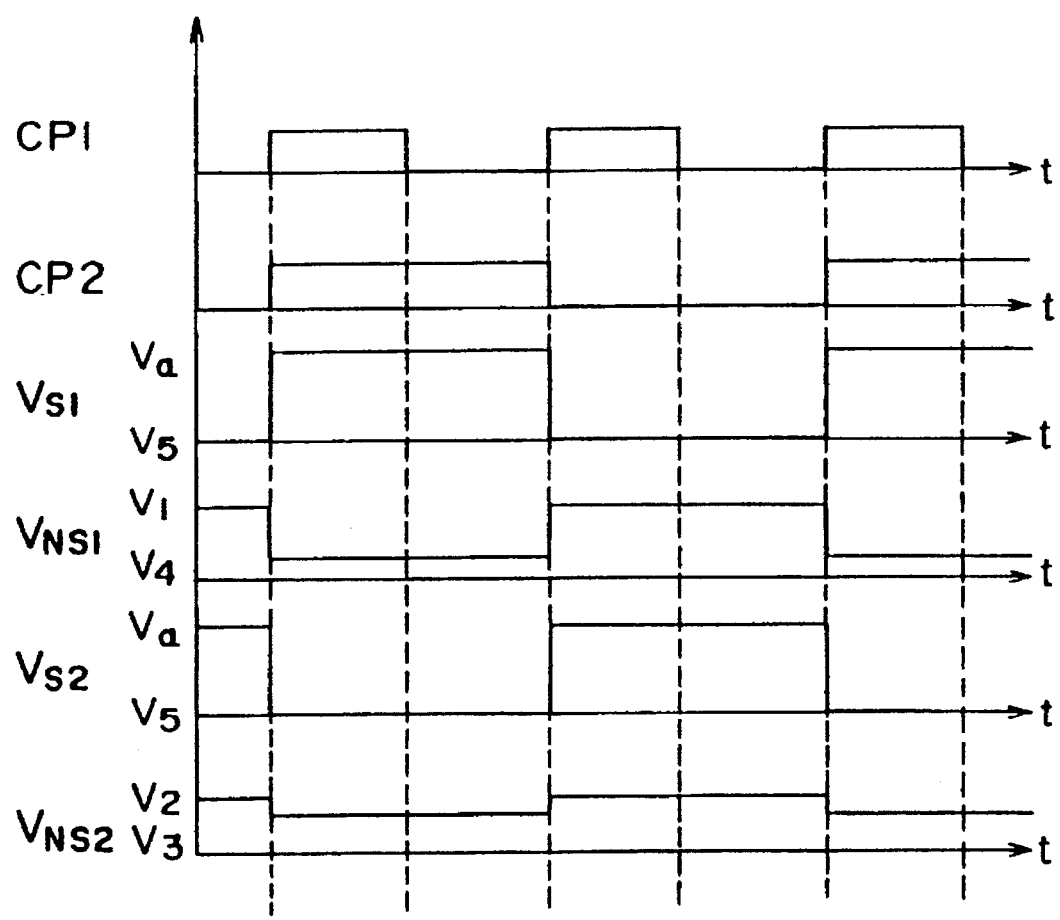

DRIVE VOLTAGE GENERATING CIRCUIT HAVING A CONTRAST CONTROL FUNCTION

CROSS REFERENCE TO RELATED APPLICATION

This application claims the priority of Japanese Patent Application Serial No. 5-219,858, filed Sep. 3, 1993, the subject matter of which is incorporated herein by reference.

BACKGROUND OF THE INVENTION

This invention relates to a drive voltage generating circuit employed in a drive unit such as a liquid crystal display or the like, and particularly to a drive voltage generating circuit suitable for providing integrated circuitry, which changes a drive voltage to adjust contrast.

As a drive voltage generating circuit used in a liquid crystal panel, there is known one described in Japanese Laid-Open Patent Application No. 5-257120, for example. Since a bias potential control circuit is added to the drive voltage generating circuit, the drive voltage generating circuit eliminates the need for provision of contrast adjusting variable resistors which have heretofore been used as external parts. Further, temperature coefficients of resistors forming a bias circuit of the drive voltage generating circuit can be made identical to those of resistors of the bias potential control circuit so as to cancel variations in resistor, which take place according to temperature However, the above drive voltage generating circuit causes a trade-off between power consumption and the quality of a reproduced image if one attempts to make improvements in the two.

SUMMARY OF THE INVENTION

It is an object of the present invention to provide a drive voltage generating circuit having low power consumption and achieving high quality of image reproduction.

To achieve this object, a drive voltage generating circuit according to the present invention comprises drive output terminals for outputting drive signals having voltage levels, a bias circuit having a first voltage terminal to be applied to a first voltage and a second voltage terminal to be applied to a second voltage. The bias circuit produces voltage signals having the drive voltage levels. A drive voltage generating circuit according to the present invention further comprises a switching circuit having input terminals coupled to the bias circuit, output terminals coupled to the drive output terminals and a control terminal receiving a first control signal, a bias potential control circuit coupled between the second voltage terminal and a third voltage terminal to be applied to a third voltage. The bias potential control circuit includes a first voltage control circuit controlling a resistance value between the second and third voltage terminals in response to contrast data signals and a second voltage control circuit controlling the resistance value between the second and third voltage terminals in response to a second control signal.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 18 is a view for describing waveforms output from a drive voltage generating circuit when select signals CP1 and CP2 are simultaneously varied.

DETAILED DESCRIPTION OF THE PREFERRED EMBODIMENTS

Figure 1:
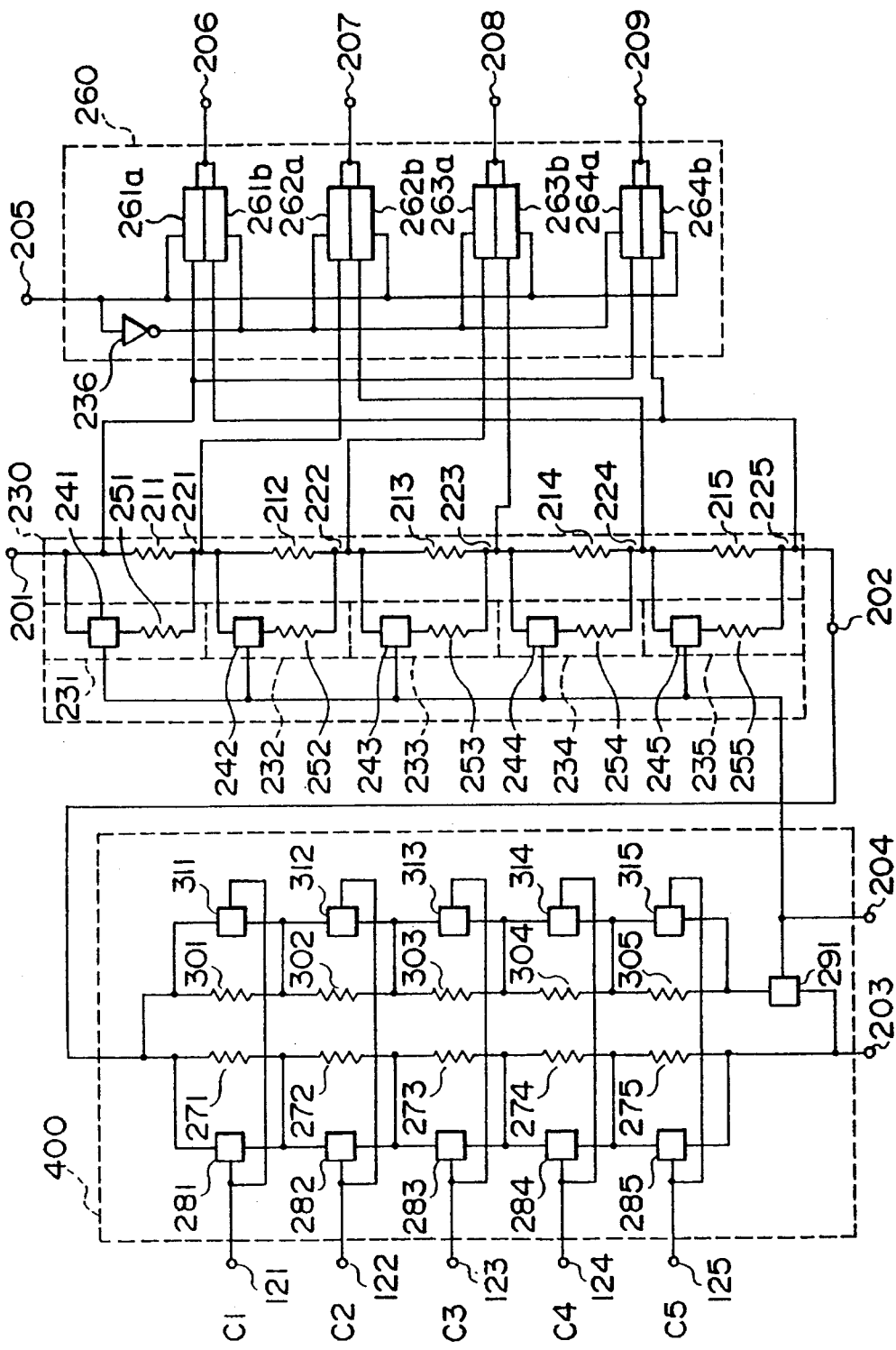
FIG. 1 is a circuit diagram showing a drive voltage generating circuit according to a first embodiment of the present invention.
Figure 2:
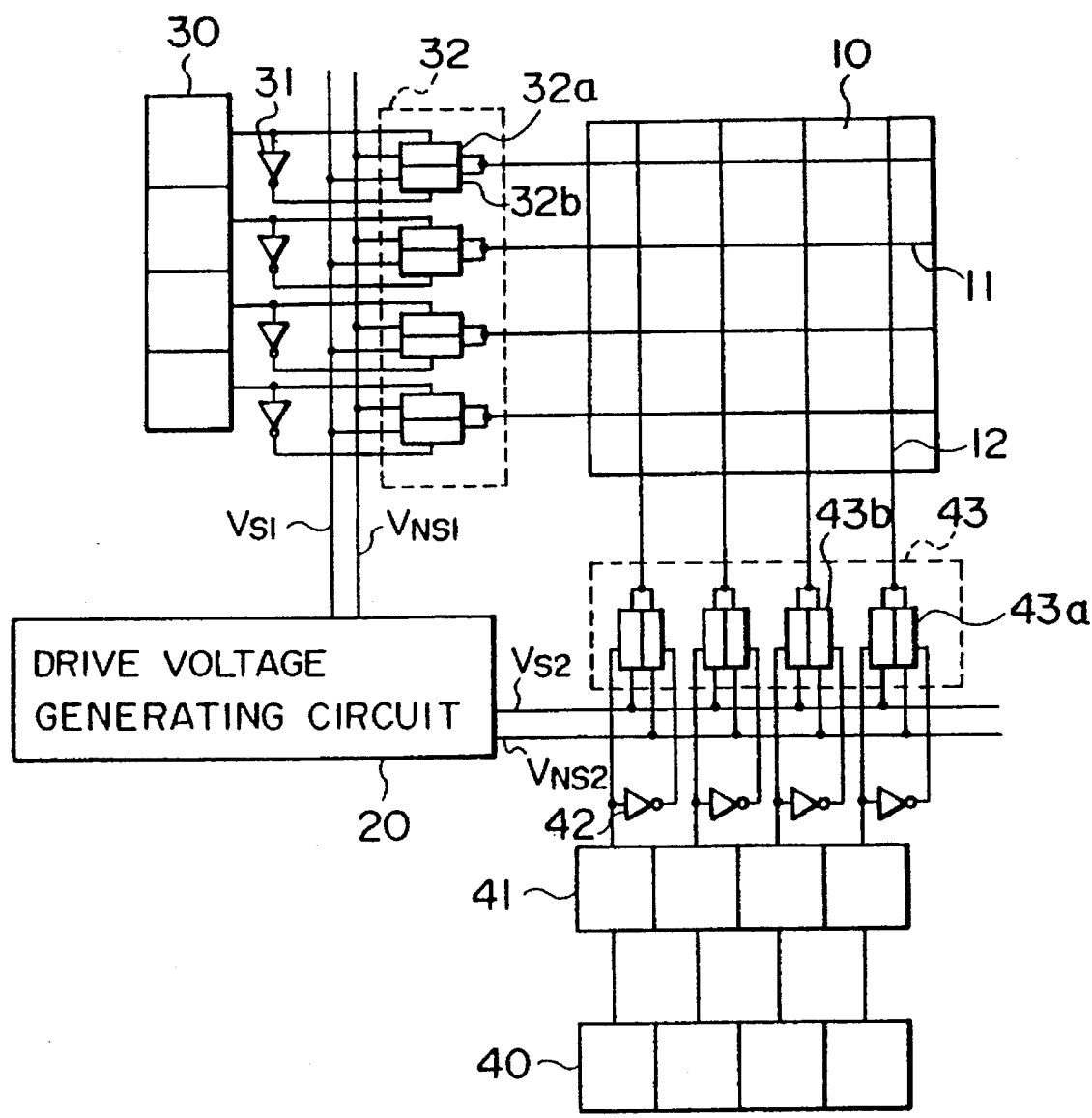
FIG. 2 is a circuit block diagram showing a liquid crystal matrix panel drive unit.

FIG. 1 is a circuit diagram showing a drive voltage generating circuit according to a first embodiment of the present invention. FIG. 2 is a circuit diagram illustrating one structure of a liquid crystal matrix panel drive unit in which the drive voltage generating circuit shown in FIG. 1 is employed. The liquid crystal matrix panel drive circuit will first be described with reference to FIG. 2.

The liquid crystal matrix panel drive unit is of a unit for driving a liquid crystal panel 10. The liquid crystal panel 10 has a plurality of scanning electrodes 11 and a plurality of signal electrodes 12 respectively disposed so as to intersect the plurality of scanning electrodes 11. Unillustrated liquid crystals are arranged in matrix form at the points where the plurality of signal electrodes 12 and the plurality of scanning electrodes 11 intersect respectively. The liquid crystal matrix panel drive unit is provided with a drive voltage generating circuit 20 for generating signals having select voltages $V_{S1}$, $V_{S2}$ and non-select signals $V_{NS1}$ and $V_{NS2}$ indicative of liquid crystal drive voltages and a scanning circuit 30 for outputting signals having levels of patterns obtained by shifting and repeating a predetermined signal level. An electronic switching circuit 32 on-off controlled based on the signals output from the scanning circuit 30 and signals obtained by inverting the output signals with inverters 31 respectively, is electrically connected to the output of the scanning circuit 30. The electronic switching circuit 32 comprises a plurality of pairs of electronic switches 32a and 32b respectively on-off controlled based on the output signals of the scanning circuit 30 and the inverted output signals of the inverters 31. Each of the pairs of electronic switches 32a and 32b controls conduction or non-conduction between the output of the drive voltage generating circuit 20 and each of the scanning electrodes 11.

The liquid crystal matrix panel drive unit is also provided with a serial-parallel converting circuit 40 for converting serial data used to determine whether each liquid crystal stays illuminated or non illuminated, into parallel data. A line memory 41 is electrically connected to the output of the serial-parallel converting circuit 40. An electronic switching circuit 43 on-off controlled based on signals output from the line memory 41 and signals obtained by inverting the output signals with inverters 42 respectively, is electrically connected to the output of the line memory 41. The electronic switching circuit 43 comprises a plurality of pairs of electronic switches 43a and 43b respectively on-off controlled based on the output signals of the line memory 41 and the inverted output signals of the inverters 42. Each of the plurality of pairs of electronic switches 43a and 43b controls conduction or non-conduction between the output of the drive voltage generating circuit 20 and each of the signal electrodes 12.

When a predetermined signal is output from the scanning circuit 30 in the liquid crystal matrix panel drive unit, the corresponding pair of electronic switches 32a and 32b of the electronic switching circuit 32 is turned on and off. Owing to such an operation, the signals having the select voltage $V_{S1}$ and the non-select voltage $V_{NS1}$, which have been output from the drive voltage generating circuit 20, are input to the corresponding scanning electrodes 11 of the liquid crystal panel 10 through the electronic switching circuit 32. Simultaneously, the serial data used for determining whether each liquid crystal is in an illuminated or non illuminated state, is converted into the parallel data by the serial-parallel converting circuit 40. The parallel data is supplied to each of the pairs of electronic switches 43a and 43b of the electronic switching circuit 43 through the line memory 41 so as to turn on and off each of the pairs of the electronic switches 43a and 43b. Accordingly, the signals having the select voltage $V_{S2}$ and the non-select voltage $V_{NS2}$, which have been output from the drive voltage generating circuit 20, are supplied to the corresponding signal electrodes 12 of the liquid crystal panel 10 through the pairs of electronic switches 43a and 43b. Therefore, each of the liquid crystals in the liquid crystal panel 10 will go on and off according to the difference in potential between the signal applied to each of the scanning electrodes 11 and the signal applied to each of the signal electrodes 12.

The drive voltage generating circuit according to the first embodiment of the present invention will now be described below with reference to FIG. 1. The drive voltage generating circuit has a first power source potential input terminal 201 to which a high power source potential $V_a$ is applied, a node 202, a second power source potential input terminal 203 to which a low power source potential $V_b$ is applied, a first select signal input terminal 204 to which a first select signal CP1 is input, a second select signal input terminal 205 to which a second select signal CP2 is input, first through fourth output terminals 206 through 209 for respectively outputting signals having select voltages $V_{S1}$, $V_{S2}$ and non-select voltages $V_{NS1}$ and $V_{NS2}$, and first through fifth control signal input terminals 121 through 125 for inputting first through fifth control signals (such as contrast data signals) C1 through C5 each having a logic level.

A bias circuit 230 for outputting signals having liquid-crystal driving bias potentials $V_1$ through $V_5$ is electrically connected between the first power source potential input terminal 201 and the node 202. Electronic switches 261a and 261b, ..., 264a and 264b each pair of which is on-off controlled based on the second select signal CP2 input from the second select signal input terminal 205 and a signal obtained by inverting the second select signal CP2 with an inverter 236, are electrically connected to their corresponding outputs of the bias circuit 230. The first through fourth output terminals 206 through 209 are electrically connected to their corresponding outputs of the electronic switches 261a and 261b, ..., 264a and 264b. A bias potential control circuit 400 for adjusting or controlling bias potentials $V_1$ through $V_5$ is electrically connected between the node 202 and the second power source potential input terminal 203.

The bias potential control circuit 400 comprises a first resistance-type voltage dividing circuit comprised of a plurality of series-connected first resistance means (such as voltage-dividing resistors or resistances) 271 through 275 and a second resistance-type voltage dividing circuit comprised of a plurality of series-connected second resistance means (such as voltage-dividing resistors or resistances) 301 through 305. The first resistance-type voltage dividing circuit is electrically connected between the node 202 and the second power source potential input terminal 203. The second resistance-type voltage dividing circuit is electrically connected between the node 202 and the second power source potential input terminal 203 through a first switching circuit 291. The first switching circuit 291 has a control terminal electrically connected to the first select signal input terminal 204. The first switching circuit 291 controls conduction or non-conduction between one end of the second resistance-type voltage dividing circuit and the second power source potential input terminal 203 in response to the first select signal CP1. In the first embodiment, the first switching circuit 291 is made up of an NMOSFET.

Second through sixth switching circuits 281 through 285 are parallel-connected to their corresponding first resistance means 271 through 275. In the first embodiment, each of the second through sixth switching circuits 281 through 285 is comprised of an NMOSFET. Further, seventh through eleventh switching circuits 311 through 315 are electrically connected to their corresponding second resistance means 301 through 305. In the first embodiment, each of the seventh through eleventh switching circuits 311 through 315 is also comprised of an NMOSFET in the same manner as described above. Control terminals of the second and seventh switching circuits 281 and 311 are electrically connected to the first control signal input terminal 121 in common. Likewise, control terminals of the third and eighth switching circuits 282 and 312 are electrically connected to the second control signal input terminal 122 in common. Control terminals of the fourth and ninth switching circuits 283 and 313 are electrically connected to the third control signal input terminal 123 in common. Control terminals of the fifth and tenth switching circuits 284 and 314 are electrically connected to the fourth control signal input terminal 124 in common. Control terminals of the sixth and twelfth switching circuits 285 and 315 are electrically connected to the fifth control signal input terminal 125. Accordingly, the second through sixth switching circuits 281 through 285 and the seventh through eleventh switching circuits 311 through 315 respectively short-circuit the first resistance means 271 through 275 and the second resistance means 301 through 305 in response to the first through fifth control signals C1 through C5.

The bias circuit 230 comprises a third resistance-type voltage dividing circuit comprised of a plurality of series-connected third resistance means (such as voltage-dividing resistors or resistances) 211 through 215, and bias resistance variable circuits 231 through 235 respectively parallel-connected to the third resistance means 211 through 215. The bias resistance variable circuits 231 through 235 are respectively comprised of twelfth through sixteenth switching circuits 241 through 245 whose control terminals are electrically connected to the first select signal input terminal 204, and fourth resistance means 251 through 255 respectively series-connected to the twelfth through sixteenth switching circuits 241 through 245. Respective one ends on the node 202 side, of the third resistance means 211 through 215 are respectively used as first through fifth outputs 221 through 225 from which signals having bias potentials $V_1$ through $V_5$ are respectively output. Since each of the twelfth through sixteenth switching circuits 241 through 245 is on-off controlled based on the first select signal CP1, respective resistance values in the third resistance-type voltage dividing circuit apparently vary in response to the first select signal CP1.

Figure 3:
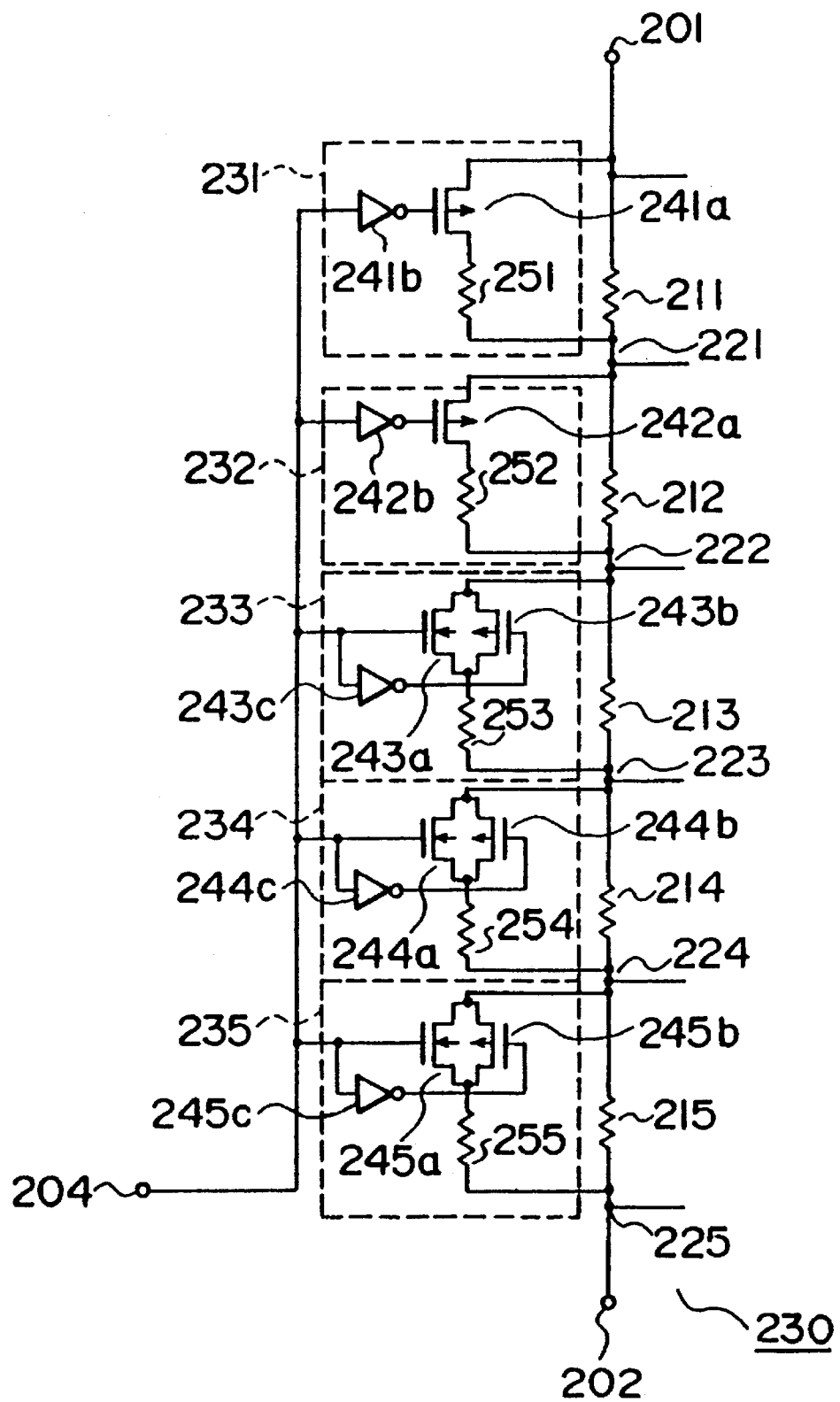
FIG. 3 is a circuit diagram illustrating a bias circuit employed in the first embodiment of the present invention.

FIG. 3 is a circuit diagram showing the bias circuit 230 employed in the first embodiment. The bias circuit 230 will hereinafter be described in further detail with reference to FIG. 3. The twelfth and thirteenth switching circuits 241 and 242 of the bias circuit 230 employed in the first embodiment are respectively comprised of PMOSFETs 241a and 242a and inverters 241b and 242b respectively electrically connected between the gate of the PMOSFET 241a and the first select signal input terminal 204 and between the gate of the PMOSFET 242b and the first select signal input terminal 204. Further, the fourteenth through sixteenth switching circuits 243 through 245 are respectively comprised of NMOSFETs 243a through 245a, PMOSFETs 243b through 245b and inverters 243c through 245c. Each of the NMOSFETs 243a through 245a and each of the PMOSFETs 243b through 245b are electrically parallel-connected to one another. The gates of the PMOSFETs 243b through 245b are respectively electrically connected to the first select signal input terminal 204 through the inverters 243c through 245c in common with the gates of the NMOSFETs 243a through 245a.

The electronic switching circuit 260 comprises the inverter 236 electrically connected to the second select signal input terminal 205, the first electronic switch 261a whose input, output and control input are respectively electrically connected to the first power source potential input terminal 201, the first output terminal 206 and the second select signal input terminal 205, the second electronic switch 261b whose input, output and control input are respectively electrically connected to the fifth output 225 of the bias circuit 230, the first output terminal 206 and the output of the inverter 236, the third electronic switch 262a whose input, output and control input are respectively electrically connected to the first output 221 of the bias circuit 230, the second output terminal 207 and the output of the inverter 236, the fourth electronic switch 262b whose input, output and control input are respectively electrically connected to the fourth output 224 of the bias circuit 230, the second output terminal 207 and the second select signal input terminal 205, the fifth electronic switch 263a whose input, output and control input are respectively electrically connected to the second output 222 of the bias circuit 230, the third output terminal 208 and the output of the inverter 236, the sixth electronic switch 263b whose input, output and control input are respectively electrically connected to the third output 223 of the bias circuit 230, the third output terminal 208 and the second select signal input terminal 205, the seventh electronic switch 264a whose input, output and control input are respectively electrically connected to the first power source potential input terminal 201, the fourth output terminal 209 and the output of the inverter 236, and the eighth electronic switch 263b whose input, output and control input are respectively electrically connected to the fifth output 225 of the bias circuit 230, the fourth output terminal 209 and the second select signal input terminal 205.

The first through eighth electronic switches 261a and 261b, ..., 264a and 264b are respectively alternately on-off controlled in response to the second select signal CP2 input through the second select signal input terminal 205 and the signal obtained by inverting the second select signal CP2 with the inverter 236. Thus, the electronic switching circuit 260 has a function for receiving the high power source potential $V_a$ and the bias potentials $V_1$ through $V_5$ and outputting signals having these potential levels as the select voltages $V_{S1}$, $V_{S2}$ and the non-select voltages $V_{NS1}$ and $V_{NS2}$ from the first through fourth output terminals.

In the drive voltage generating circuit according to the first embodiment, the high power source potential $V_a$ applied to the first power source potential input terminal 201 is set to 5 V, whereas the low power source potential $V_b$ applied to the second power source potential input terminal 203 is set to 0 V. All the resistance values of the third resistance means 211 through 215 are set to the same resistance value, i.e., 3KΩ. All the resistance values of the fourth resistance means 251 through 255 are set to the same resistance value, i.e., 1.5KΩ. The resistance values of the first resistance means 271 through 275 are set to 0.5KΩ, 1.0KΩ, 2.0KΩ, 4.0KΩ and 8.0KΩ in order of the reference numerals 275 through 271. Namely, the resistance value of the first resistance means 274 is set to twice the resistance value of the first resistance means 275. The resistance value of the first resistance means 273 is set to twice the resistance value of the first resistance means 274. The resistance value of the first resistance means 272 is set to twice the resistance value of the first resistance means 273. The resistance value of the first resistance means 271 is set to twice the resistance value of the first resistance means 272. Accordingly, the ratio between the resistance values of the first resistance means 275 through 271 is represented as the first resistance means 275: the first resistance means 274: the first resistance means 273: the first resistance means 272: the first resistance means 271=1:2:4:8:16. Likewise, the resistance values of the second resistance means 301 through 305 are set to 0.25KΩ, 0.5KΩ, 1.0KΩ, 2.0KΩ and 4.0KΩ in such a manner that the ratio between the resistance values of the second resistance means 301 through 305 is represented as the second resistance means 305: the second resistance means 304: the second resistance means 303: the second resistance means 302: the second resistance means 301=1:2 4:8:16.

Incidentally, the ratio between the resistance values of the first resistance means 275 through 271 and the ratio between the resistance values of the second resistance means 301 through 305 are set so that the former and latter resistance values are respectively doubled in order each time the respective resistance means are spaced away from the second power source potential input terminal 203. It is however unnecessary to strictly double each resistance value in order. Each resistance value may fall within a range of ±15% or so.

The operation of the drive voltage generating circuit according to the first embodiment will now be described below.

This description is intended for the application of the drive voltage generating circuit shown in FIG. 1 to the liquid crystal panel 10 shown in FIG. 2 having a 1/16 duty. The number of biases in the drive voltage generating circuit is 1/5.

In the drive voltage generating circuit according to the first embodiment shown in FIG. 1, the first select signal CP1 and the second select signal CP2 are output from an unillustrated select signal generating circuit. The first select signal CP1 controls the first switching circuit (NMOSFET) 291 and each of the twelfth through sixteenth switching circuits 241 through 245 so that they are simultaneously turned on and off. The contrast data C1 through C5 output from an unillustrated contrast data generating circuit are defined as binary codes. The C1 side is defined as the leftmost bits whereas the C5 side is defined as the rightmost bits. Further, values obtained by representing 5-bit data of the contrast data C1 through C5 in the form of a hexadecimal display are defined as contrast data codes.

Figure 4:
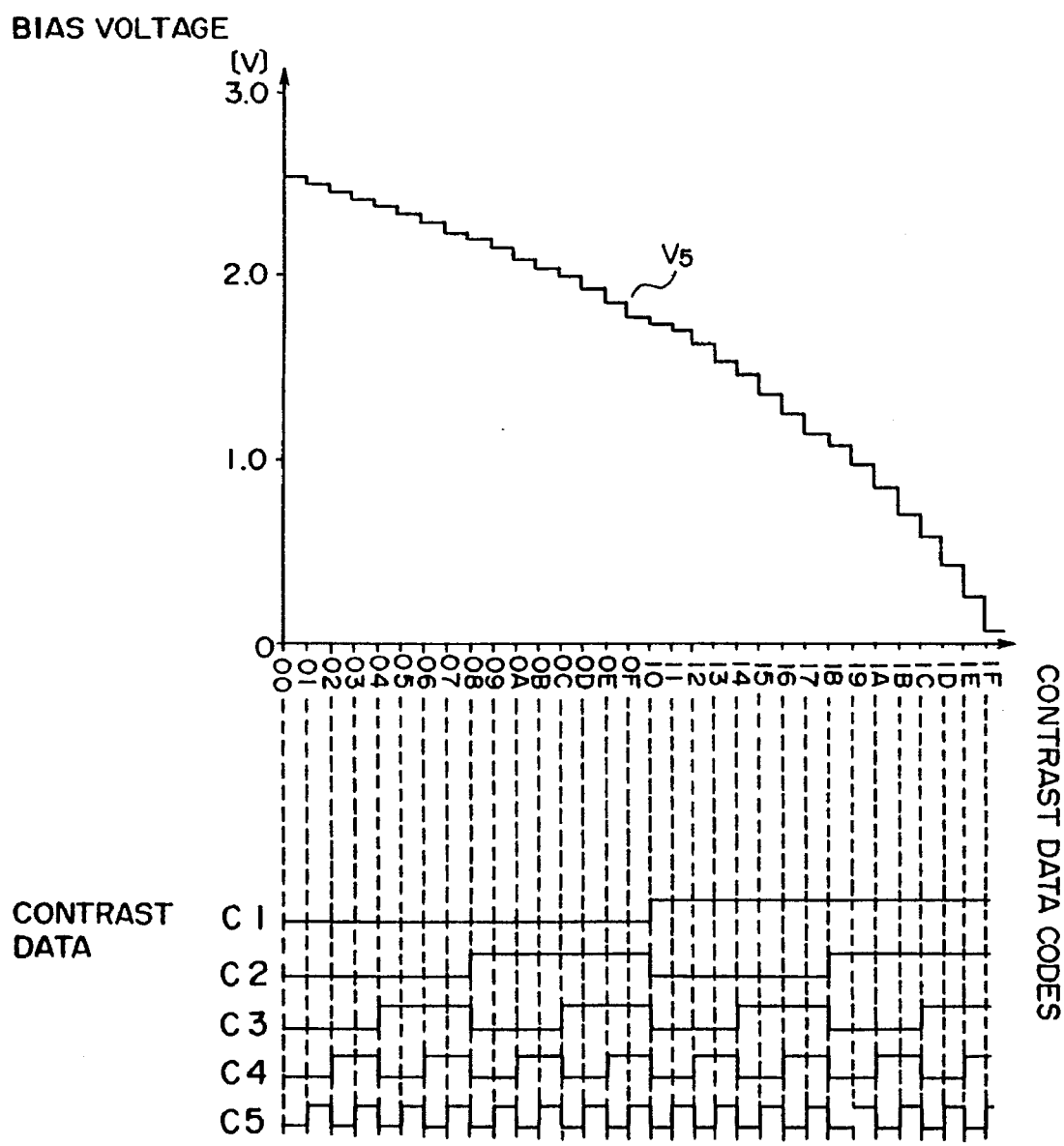
FIG. 4 is a view for describing the relationship between contrast data C1 through C5 and a bias voltage $V_5$ both employed in the drive voltage generating circuit shown in FIG. 1.

When a power source is turned on to work the drive voltage generating circuit according to the first embodiment shown in FIG. 1, the potential (bias potential $V_5$) at the node 202 is brought to a potential level of 0 V or more because the low power source potential $V_b$=0 V. The relationship between the bias potential $V_5$ and the contrast data codes is shown in the following Table 1. Further, the relationship between timing charts related to the contrast data C1 through C5 and the bias potential $V_5$ corresponding to the timing charts is illustrated in FIG. 4.

TABLE 1

| CONTRAST DATA CODES | CONTRAST DATA | | | | | NMOS Transistors being ON state | $V_5$ (V) |
|---|---|---|---|---|---|---|---|
| | $C_1$ | $C_2$ | $C_3$ | $C_4$ | $C_5$ | | |
| 00 | 0 | 0 | 0 | 0 | 0 | NULL | 2.54 |
| 01 | 0 | 0 | 0 | 0 | 1 | 285, 315 | 2.51 |
| 02 | 0 | 0 | 0 | 1 | 0 | 284, 314 | 2.47 |
| 03 | 0 | 0 | 0 | 1 | 1 | 284, 285, 314, 315 | 2.43 |
| 04 | 0 | 0 | 1 | 0 | 0 | 283, 313 | 2.38 |
| 05 | 0 | 0 | 1 | 0 | 1 | 283, 285, 313, 315 | 2.34 |
| 06 | 0 | 0 | 1 | 1 | 0 | 283, 284, 313, 314 | 2.29 |
| 07 | 0 | 0 | 1 | 1 | 1 | 283, 284, 285, 313, 314, 315 | 2.26 |

TABLE 1-continued

| CONTRAST DATA CODES | CONTRAST DATA | | | | | NMOS Transistors being ON state | $V_5$ (V) |
|---|---|---|---|---|---|---|---|
| | $C_1$ | $C_2$ | $C_3$ | $C_4$ | $C_5$ | | |
| 08 | 0 | 1 | 0 | 0 | 0 | 282, 312 | 2.18 |
| 09 | 0 | 1 | 0 | 0 | 1 | 282, 285, 312, 315 | 2.14 |
| 0A | 0 | 1 | 0 | 1 | 0 | 282, 284, 312, 314 | 2.09 |
| 0B | 0 | 1 | 0 | 1 | 1 | 282, 284, 285, 312, 314, 315 | 2.04 |
| 0C | 0 | 1 | 1 | 0 | 0 | 282, 283, 312, 313 | 1.97 |
| 0D | 0 | 1 | 1 | 0 | 1 | 282, 283, 285, 312, 313, 315 | 1.92 |
| 0E | 0 | 1 | 1 | 1 | 0 | 282, 283, 284, 312, 313, 314 | 1.86 |
| 0F | 0 | 1 | 1 | 1 | 1 | 282, 283, 284, 285, 312, 313, 314, 315 | 1.80 |
| 10 | 1 | 0 | 0 | 0 | 0 | 281, 311 | 1.68 |
| 11 | 1 | 0 | 0 | 0 | 1 | 281, 285, 311, 315 | 1.63 |
| 12 | 1 | 0 | 0 | 1 | 0 | 281, 284, 311, 314 | 1.55 |
| 13 | 1 | 0 | 0 | 1 | 1 | 281, 284, 285, 311, 314, 315 | 1.49 |
| 14 | 1 | 0 | 1 | 0 | 0 | 281, 283, 311, 313 | 1.38 |
| 15 | 1 | 0 | 1 | 0 | 1 | 281, 283, 285, 311, 313, 315 | 1.31 |
| 16 | 1 | 0 | 1 | 1 | 0 | 281, 283, 284, 311, 313, 314 | 1.22 |
| 17 | 1 | 0 | 1 | 1 | 1 | 281, 283, 284, 285, 311, 313, 314, 315 | 1.15 |
| 18 | 1 | 1 | 0 | 0 | 0 | 281, 282, 311, 312 | 0.99 |
| 19 | 1 | 1 | 0 | 0 | 1 | 281, 282, 285, 311, 312, 315 | 0.92 |
| 1A | 1 | 1 | 0 | 1 | 0 | 281, 282, 284, 311, 312, 314 | 0.80 |
| 1B | 1 | 1 | 0 | 1 | 1 | 281, 282, 284, 285, 311, 312, 314, 315 | 0.70 |
| 1C | 1 | 1 | 1 | 0 | 0 | 281, 282, 283, 311, 312, 313 | 0.54 |
| 1D | 1 | 1 | 1 | 0 | 1 | 281, 282, 283, 285, 311, 312, 313, 315 | 0.44 |
| 1E | 1 | 1 | 1 | 1 | 0 | 281, 282, 283, 284, 311, 312, 313, 314 | 0.30 |
| 1F | 1 | 1 | 1 | 1 | 1 | 281, 282, 283, 284, 285, 311, 312, 313, 314, 315 | 0.17 |

The contrast data C1 through C5 output from the unillustrated contrast data generating circuit are first input to their corresponding control signal input terminals 121 through 125 of the drive voltage generating circuit according to the first embodiment shown in FIG. 1. When all the contrast data C1 through C5 are "L" in level (the contrast data code is "00"), the second through sixth switching circuits 281 through 285 and the seventh through eleventh switching circuits 311 through 315 are all turned off. Therefore, a voltage of about 2.54 V equivalent to a fixed fraction of the applied voltage $V_a-V_b$=5 V, which is made using a resistance value (about 5.17KΩ) obtained by combining the resistance values of the first resistance means 271 through 275 and those of the second resistance means 301 through 305 and a resistance value (about 5KΩ) obtained by combining the resistance values in the bias circuit 230, is determined as a potential level (bias potential $V_5$) on the node 202.

When the contrast data code is of "01" (i.e., the contrast data C1 through C4 are "L" in level and the contrast data C5 is "H" in level), only the sixth switching circuit 285 and the eleventh switching circuit 315 are turned on. A voltage of about 2.51 V equivalent to a fixed fraction of the applied voltage $V_a-V_b$=5 V, which is made using both a resistance value (about 5.04KΩ) obtained by combining the resistance values of both an on resistance of the sixth switching circuit 285 and the first resistance means 271 through 274 and the resistance values of both an on resistance of the eleventh switching circuit 315 and the second resistance means 301 through 304, and a resistance value (about 5KΩ) obtained by combining the resistance values in the bias circuit 230, is determined as the bias potential $V_5$.

When the contrast data code is of "02" (i.e., the contrast data C1 through C3 and C5 are "L" in level and the contrast data C4 is of the "H" level), only the fifth switching circuit 284 and the tenth switching circuit 314 are turned on. A voltage of about 2.47 V equivalent to a fixed fraction of the applied voltage $V_a-V_b=5$ V, which is made using both a resistance value (about 4.87KΩ) obtained by combining the resistance values of both an on resistance of the fifth switching circuit 284 and the first resistance means 271 through 273 and 275 and the resistance values of both an on resistance of the tenth switching circuit 314 and the second resistance means 301 through 303 and 305, and a resistance value (about 5KΩ) obtained by combining the resistance values in the bias circuit 230, is determined as the bias potential $V_5$.

When the contrast data code is of "03" (i.e., the contrast data C1 through C3 are "L" in level and the contrast data C4 and C5 are "H" in level), the fourth, fifth, tenth and eleventh switching circuits 284, 285, 314 and 315 are turned on. A voltage of about 2.43 V equivalent to a fixed fraction of the applied voltage $V_a-V_b=5$ V, which is made using both a resistance value (about 4.74KΩ) obtained by combining the resistance values of both on resistances of the fourth and fifth switching circuits 284 and 285 and the first resistance means 271 through 273 and the resistance values of both on resistances of the tenth and eleventh switching circuits 314 and 315 and the second resistance means 301 through 303, and a resistance value (about 5KΩ) obtained by combining the resistance values in the bias circuit 230, is determined as the bias potential $V_5$.

When the contrast data codes subsequently changes in order from "04" to "1E" as shown in FIG. 4 in the same manner as described above, the second through sixth switching circuits 281 through 285 and the seventh through eleventh switching circuits 311 through 315 are turned on so as to correspond to the contrast data. Accordingly, the bias potential $V_5$ is decided or determined based on a voltage equivalent to a fixed fraction of the applied voltage $V_a-V_b=5$ V, which is made using the combined resistance value in the bias potential control circuit 400, which is obtained in consideration of the values of the on resistances of both the second through sixth switching circuits 281 through 285 and the seventh through eleventh switching circuits 311 through 315, and the combined resistance value (about 5KΩ) in the bias circuit 230. However, the bias potential $V_5$ is gradually reduced.

When the contrast data code is represented as "1E", only the contrast data C5 is brought to the "L" level and the contrast data C1 through C4 are brought to the "H" level. Therefore, the second through fifth switching circuits 281 through 284 and the seventh through tenth switching circuits 311 through 314 are turned on. Accordingly, a voltage of about 0.30 V equivalent to a fixed fraction of the applied voltage $V_a-V_b=5$ V, which is made using both a resistance value (about 0.32KΩ) comprising a value obtained by combining the values of the on resistances of the second through fifth switching circuits 281 through 284 and the values of the on resistances of the seventh through tenth switching circuits 311 through 314 and a value obtained by combining the resistance values of the sixth and eleventh switching circuits 285 and 315, and a resistance value (about 5KΩ) obtained by combining the resistance values in the bias circuit 230, is obtained as the bias potential $V_5$.

When the contrast data code is of "1F", all the contrast data C1 through C5 are brought to the "H" level. Therefore, the second through sixth switching circuits 281 through 285 and the seventh through eleventh switching circuits 311 through 315 are all turned on. A voltage of about 0.17 V equivalent to a fixed fraction of the applied voltage $V_a-V_b=5$ V, which is made using both a resistance value (0.18KΩ) obtained by combining the values of the on resistances of the second through sixth switching circuits 281 through 285 and the seventh through eleventh switching circuits 311 through 315 and a resistance value (about 5KΩ) obtained by combining the resistance values in the bias circuit 230, is determined as the bias potential $V_5$.

The bias potential $V_5$ can be determined in the above-described manner if the contrast data codes are decided. As is thus apparent from FIGS. 1 and 4, the bias potential $V_5$ is controlled to a voltage range of 0.17 V through 2.54 V represented in 32 steps according to the contrast data C1 through C5 output from the unillustrated contrast data generating circuit so that it is monotonously reduced by the bias potential control circuit 400 as the contrast data code increases in number.

The relationship between the bias potential $V_1$ equivalent to a potential at a point where the third resistance means 211 and the third resistance means 212 are connected to each other and the bias potentials $V_2$, $V_3$, $V_4$ and $V_5$ equivalent to potentials at connecting points of the third resistance means 212 through 215 will now be described. That is, if the remaining bias potential $V_1$ through $V_4$ are represented with the bias potential $V_5$ adjustable by the contrast data C1 through C5 as reference, then they are expressed in the following manner. The bias potentials $V_1$ through $V_4$ are determined based on the bias potential $V_5$.

$$V_1 = \tfrac{4}{5}(V_a-V_5)(V), \ V_2=\tfrac{3}{5}(V_a-V_5)(V), \ V_3=\tfrac{2}{5}(V_a-V_5)(V), \ V_4=\tfrac{1}{5}(V_a-V_5)(V)$$

Thus, a control range of a drive voltage $(V_a-V_5)$ of each liquid crystal extends from 2.64 V to 4.83 V. This voltage range shows that a normal drive voltage of a liquid crystal having a 1/16 duty at a temperature of 25° C. is about 4.2 V or so. This voltage range exhibits a voltage level which can sufficiently correspond to a variation in the production of each liquid crystal and a change in temperature of each liquid crystal even if the liquid crystal drive voltage changes from 3.9 V to 4.5 V.

As shown in FIG. 4, a one-step width of the voltage controlled by the contrast data C1 through C5 is represented narrowly as about 70 mV. It is also possible to effect minute control or adjustment on the contrast of each liquid crystal. If it is unnecessary to perform a minute adjustment of 70 mV or so to the step width, then the number of the contrast data C1 through C5, the first resistance means 271 through 275, the second resistance means 301 through 305, the third resistance means 211 through 215 and the fourth resistance means 251 through 255 may be reduced from five sets to four sets or to three sets.

Figure 5:
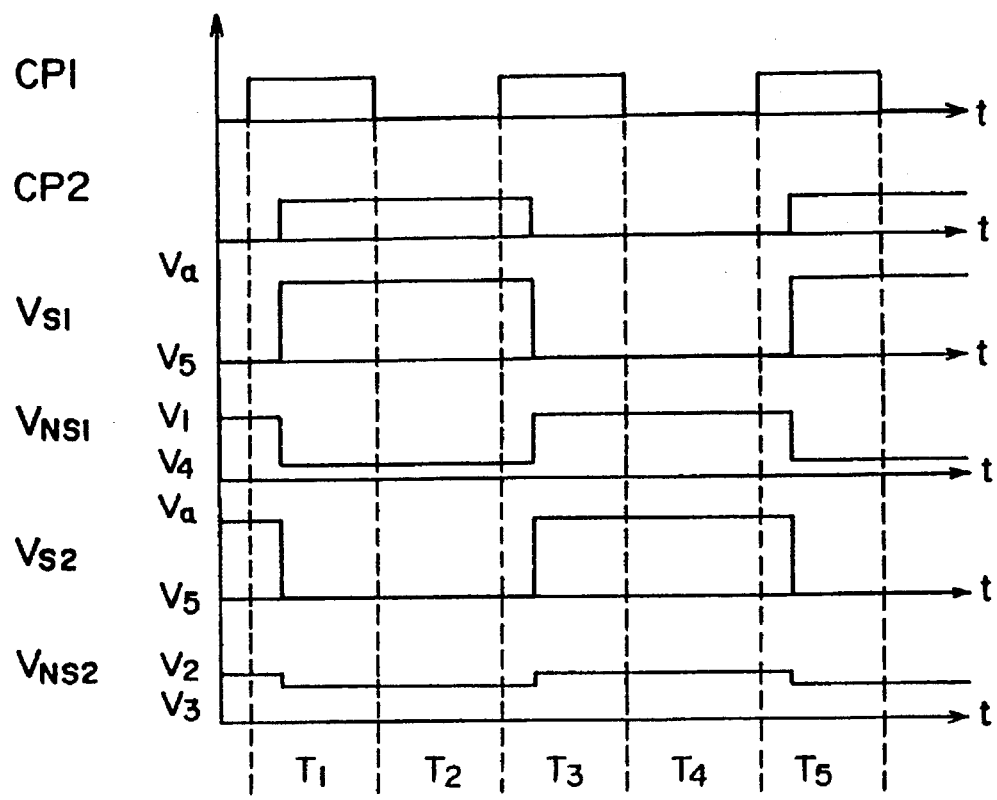
FIG. 5 is a view for describing the relationship between waveforms output from the drive voltage generating circuit shown in FIG. 1 and select signals CP1 and CP2 input thereto.

FIG. 5 is a view for describing waveforms of the select signals CP1 and CP2 respectively input from the first select signal input terminal 204 and the second select signal input terminal 205 both shown in FIG. 1 and waveforms of the select voltages $V_{S1}$, $V_{S2}$ and non-select voltages $V_{NS1}$ and $V_{NS2}$ respectively output from the output terminals 206 through 209.

When the first select signal CP1 shown in FIG. 5 is generated from the unillustrated select signal generating circuit and input to the first select signal input terminal 204, the bias potentials $V_1$ through $V_5$ are determined. When the second select signal CP2 is generated from the select signal generating circuit and input to the second select signal input terminal 205, the first through seventh electronic switches 261a through 264a and the second through eighth electronic switches 261b through 264b are alternately on-off operated in response to the second select signal CP2 and the signal obtained by inverting the second select signal CP2 with the inverter 236 so that the bias potentials $V_1$ through $V_5$ output from the bias circuit 230 are output to their corresponding first through fourth output terminals 206 through 209.

When the second select signal CP2 is "H" in level, the bias potential $V_a$ is output from the first output terminal 206. On the other hand, when the second select signal CP2 is "L" in level, the select voltage $V_{S1}$ having the bias potential $V_5$ is output from the first output terminal 206. When the second select signal CP2 is "H" in level, the bias potential $V_4$ is output from the second output terminal 207. On the other hand, when the second select signal CP2 is "L" in level, the non-select voltage $V_{NS1}$ having the bias potential $V1$ is output from the second output terminal 207. When the second select signal CP2 is "H" in level, the bias potential $V_5$ is output from the third output terminal 208. On the other hand, when the second select signal CP2 is "L" in level, the select voltage $V_{S2}$ having the bias potential $V_a$ is output from the third output terminal 208. When the second select signal CP2 is "H" in level, the bias potential $V_2$ is output from the fourth output terminal 209. On the other hand, when the second select signal CP2 is "L" in level, the non-select voltage $V_{NS2}$ having the bias potential $V_3$ is output from the fourth output terminal 209.

The signals having the select voltage $V_{S1}$ and the non-select voltages $V_{NS1}$ output from the first and second output terminals 206 and 207 respectively are supplied to their corresponding electronic switches 32a and 32b of the electronic switching circuit 32 in the liquid crystal matrix panel drive unit shown in FIG. 2. The electronic switches 32a and 32b are respectively on-off controlled based on the output signal of the scanning circuit 30 and the signal obtained by inverting the output signal with the inverter 31. The signals having the select voltage $V_{S1}$ and the non-select voltage $V_{NS1}$, which have passed through the electronic switches 32a and 32b, are supplied to the corresponding scanning electrode 11 of the liquid crystal matrix panel drive unit.

Further, the signals having the select voltage $V_{S2}$ and the non-select voltage $V_{NS2}$ output from the third and fourth output terminals 208 and 209 respectively are supplied to their corresponding electronic switches 43a and 43b of the electronic switching circuit 43 in the liquid crystal matrix panel drive unit shown in FIG. 2. The electronic switches 43a and 43b are respectively on-off controlled based on the output signal of the line memory 41 and the signal obtained by inverting the output signal with the inverter 42. Further, the signals having the select voltage $V_{S2}$ and the non-select voltage $V_{NS2}$, which have passed through the electronic switches 43a and 43b, are supplied to the corresponding signal electrode 12 of the liquid crystal matrix panel drive unit.

Now, the contrast in the illumination/nonillumination of each liquid crystal is decided in a certain voltage region, based on the difference in potential between the scanning electrode 11 and the signal electrode 12 of each liquid crystal. Therefore, the contrast for each liquid crystal can be adjusted or controlled based on the contrast data C1 through C5 shown in the Table 1.

A description will now be made of the current used up by the drive voltage generating circuit according to the first embodiment and the rounding of each waveform output from the drive voltage generating circuit. In this description, all the values of the on resistances of the first through fourth electronic switches 261a through 262b employed in the drive voltage generating circuit according to the first embodiment are taken as 2KΩ and all the values of the on resistances of the fifth through eighth electronic switches 263a through 264b employed in the drive voltage generating circuit are taken as 1KΩ in addition to conditions for the drive voltage generating circuit according to the first embodiment. The frequency of the second select signal CP2 is taken as 75 Hz.

Further, the on resistance values of the electronic switches 32a and 32b employed in the liquid crystal matrix panel drive unit shown in FIG. 2 are respectively taken as 56KΩ and the on resistance values of the electronic switches 43a and 43b are respectively taken as 75KΩ. The capacity per scanning electrode 11 is taken as 270 pF and the capacity per signal electrode 12 is taken as 100 pF. Further, consider that the liquid crystal matrix panel drive unit has sixteen scanning electrodes 11 and a hundred of signal electrodes 12.

The current consumed by the drive voltage generating circuit according to the first embodiment and the rounding of each waveform output therefrom will now be described under the above conditions with reference to the output waveform chart shown in FIG. 5.

A first period in which the first select signal CP1 is of an "H" level, is defined as $T_1$. A first period in which the first select signal CP1 is of an "L" level is defined as $T_2$. A period in which the first select signal CP1 is "H" in level subsequently to the period $T_2$, is defined as $T_3$. A period in which the first select signal CP1 is "L" in level after the period $T_3$, is defined as $T_4$. A period in which the first select signal CP1 is "H" in level after the period $T_4$, is defined as $T_5$. Incidentally, all the periods $T_1$ through $T_5$ are identical in length to each other. All the contrast data C1 through C5 are "L" in level. The signal having the non-select voltage $V_{NS1}$ output from the second output terminal 207 is supplied to each scanning electrode 11. A description will now be made of the case where the potential level of each scanning electrode 11 changes from $V_4$ to $V_1$.

During the period $T_1$, the first select signal CP1 is first brought to the "H" level. At this time, the signal having the bias potential $V_4$ level as the non-select voltage $V_{NS1}$ is output from the second output terminal 207 when the second select signal CP2 is in an "H" level state. Since the contrast data C1 through C5 are all "L" in level, the first switching circuit 291 is held on, the second through eleventh switching circuits 281 through 285 and 311 through 315 are all held off and the twelfth through sixteenth switching circuits 241 through 245 are all held on. Accordingly, the combined resistance value in the bias potential control circuit 400 becomes about 5.17KΩ and the combined resistance value in the bias circuit 230 becomes about 5KΩ. Since $V_a-V_b=5$ V, the current to be consumed during the period $T_1$ reaches 0.492 mA.

Next, the first select signal CP1 is of the "L" level during the period $T_2$. At this time, the second select signal CP2 is "H" in level and the signal having the bias potential $V_4$ level as the non-select voltage $V_{NS1}$ is output from the second output terminal 207. Since the contrast data C1 through C5 are all "L" in level, the first through sixteenth switching circuits 291, 281 through 285, 311 through 315 and 241 through 245 are all in an off state. Accordingly, the combined resistance value in the bias potential control circuit 400 reaches about 15.5KΩ and the combined resistance value in the bias circuit 230 becomes about 15KΩ. Since $V_a-V_b=5$ V, the current to be consumed during the period $T_2$ reaches 0.164 mA.

During the period $T_3$, the first select signal CP1 is "H" in level. At this time, the signal having the bias potential V1 level as the non-select voltage $V_{NS1}$ is output from the second output terminal 207. Therefore, the potential level of each scanning electrode 11 changes from $V_4$ to $V_1$ during the period $T_3$. Since the contrast data C1 through C5 are all "L" in level, the first switching circuit 291 is held on, the second through eleventh switching circuit 281 through 285 and 311 through 315 are all held off and the twelfth through sixteenth switching circuits 241 through 245 are all held on. Accordingly, the combined resistance value in the bias potential control circuit 400 reaches about 5.17KΩ and the combined resistance value in the bias circuit 230 becomes about 5KΩ. Since $V_a-V_b=5$ V, the current to be consumed during the period $T_3$ becomes about 0.492 mA.

Figure 6:
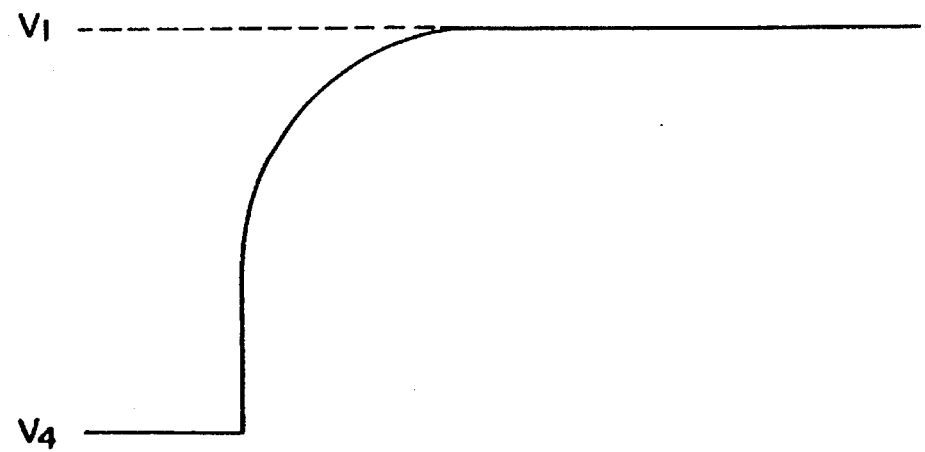
FIG. 6 is a view for describing the level of a signal output from a second output terminal employed in the drive voltage generating circuit shown in FIG. 1.

FIG. 6 is a view for describing the manner in which a potential level of a signal output from the second output terminal 207 during the time period $T_3$ varies with time. As is understood from FIG. 6, the potential level of the output signal varies in analog form so as to create a gentle curve without varying in digital form like the first and second select signals CP1 and CP2. A period (rounding) in which the potential level varies in analog form becomes about 65.7 mS. This rounding represents about 7.89% of the pulse width of the second select signal CP2.

During the period $T_4$, the first select signal CP1 is of the "L" level. At this time, the second select signal CP2 is "L" in level and the signal having the bias potential $V_1$ level as the non-select voltage $V_{NS1}$ is output from the second output terminal 207. Since the contrast data C1 through C5 are all "L" in level, the first through sixteenth switching circuits 291, 281 through 285, 311 through 315 and 241 through 245 are all held off. Thus, the combined resistance value in the bias potential control circuit 400 reaches about 15.5KΩ and the combined resistance value in the bias circuit 230 becomes about 15KΩ. Since $V_a-V_b=5$ V, the current to be consumed during the period $T_4$ becomes 0.164 mA.

Since a state developed during the period $T_5$ is the very same as that developed during the period $T_1$, its description will be omitted. Subsequently, the periods $T_1$ through $T_4$ are repeated.

Now, the current used up by the drive voltage generating circuit according to the first embodiment when the potential level of each scanning electrode 11 changes from $V_4$ to $V_1$, means the average current consumed during the periods $T_1$ through $T_4$. Since the periods $T_1$ through $T_4$ are identical in length to each other as described above, the average of current consumption reaches about 0.328 mA obtained from the simple averaging process.

Incidentally, the above description has been made of the case where the current consumed by the drive voltage generating circuit according to the first embodiment is at a minimum under the condition that the contrast data C1 through C5 are all "L" in level. If, on the other hand, the current used up by the drive voltage generating circuit according to the first embodiment is calculated in the same manner as described above where the current consumed by the drive voltage generating circuit reaches a maximum under the condition that the contrast data C1 through C5 are all "H" in level, then the average of current consumption reaches about 0.646 mA and the rounding of each output waveform represents about 7.89% of the pulse width of the second select signal CP2.

Now, the drive voltage generating circuit according to the first embodiment, which has been described in Japanese Patent Application No. 4-54814, will be used as an object to be compared. When the rounding of each output waveform of the drive voltage generating circuit is set so as to reach about 7.89%, the minimum average of current consumption becomes about 0.509 mA and the maximum average of current consumption becomes about 0.986 mA.

Thus, reductions in the minimum and maximum currents consumed by the drive voltage generating circuit according to the first embodiment of the present invention respectively reach about 0.181 mA (about 35.6%) and about 0.340 mA (about 34.5%) as compared with the drive voltage generating circuit according to the first embodiment, which has been described in Japanese Patent Application No. 4-54814.

Further, the average of current consumption can be reduced by changing the lengths of the periods $T_1$ through $T_4$ without changing the circuit configuration of the drive voltage generating circuit according to the first embodiment. An example of a drive voltage generating circuit in which the ratio between the lengths of the periods $T_1$ through $T_4$ is set as $T_1:T_2:T_3:T_4=1:2:1:2$, will be described below as a second embodiment.

Figure 7:
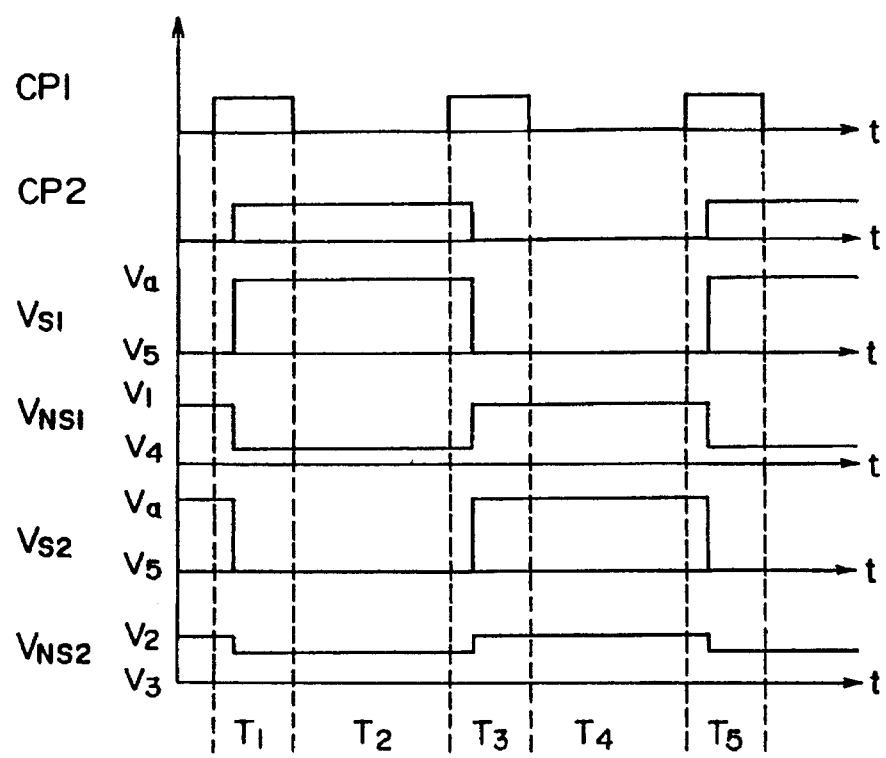
FIG. 7 is a view for describing the relationship between waveforms output from a drive voltage generating circuit according to a second embodiment of the present invention and select signals CP1 and CP2 input thereto.

FIG. 7 is a view for describing waveforms of first and second select signals CP1, CP2 and signals output from first through fourth output terminals 206 through 209 all of which are employed in the second embodiment of the present invention. The operation of the drive voltage generating circuit according to the second embodiment of the present invention will be described below with reference to FIG. 7 and FIG. 1.

During a period $T_1$, the first select signal CP1 is first "H" in level. At this time, a signal having a bias potential $V_4$ level as a non-select voltage $V_{NS1}$ is output from the second output terminal 207 when the second select signal CP2 is "H" in level. Since contrast data C1 through C5 are all "L" in level, a first switching circuit 291 is held on, second through eleventh switching circuits 281 through 285 and 311 through 315 are all held off and twelfth through sixteenth switching circuits 241 through 245 are all held on. Accordingly, the combined resistance value in a bias potential control circuit 400 reaches about 5.17KΩ and the combined resistance value in a bias circuit 230 becomes about 5KΩ. Since $V_a-V_b=5$ V, the current to be used up during the period $T_1$ becomes 0.492 mA.

Next, the first select signal CP1 is brought to an "L" level during a period $T_2$. At this time, the second select signal CP2 is "H" in level and the signal having the bias potential $V_4$ level as the non-select voltage $V_{NS1}$ is output from the second output terminal 207. Since the contrast data C1 through C5 are all "L" in level, the first through sixteenth switching circuits 291, 281 through 285, 311 through 315 and 241 through 245 are all held off. Accordingly, the combined resistance value in the bias potential control circuit 400 reaches about 15.5KΩ and the combined resistance value in the bias circuit 230 reaches about 15KΩ. Since $V_a-V_b=5$ V, the current to be used up during the period $T_2$ is brought to 0.164 mA.

During a period $T_3$, the first select signal CP1 is "H" in level. At this time, a signal having a bias potential $V_1$ level as the non-select voltage $V_{NS1}$ is output from the second output terminal 207 when the second select signal CP2 is in an "H" level state. Therefore, a potential level of a corresponding scanning electrode 11 varies from $V_4$ to $V_1$ during the period $T_3$. Since the contrast data C1 through C5 are all "L" in level, the first switching circuit 291 is held on, the second through eleventh switching circuits 281 through 285 and 311 through 315 are held off and the twelfth through sixteenth switching circuits 241 through 245 are all held on. Thus, the combined resistance value in the bias potential control circuit 400 reaches about 5.17KΩ and the combined resistance value in the bias circuit 230 becomes about 5KΩ. Since $V_a-V_b=5$ V, the current to be consumed during the period $T_3$ reaches 0.492 mA.

During a period $T_4$, the first select signal CP1 is "L" in level. At this time, the second select signal CP2 is "L" in level and the signal having the bias potential $V_1$ level as the non-select voltage $V_{NS1}$ is output from the second output terminal 207l. Since the contrast data C1 through C5 are all "L" in level, the first through sixteenth switching circuits 291, 281 through 285, 311 through 315 and 241 through 245 are all in an off state. Thus, the combined resistance value in the bias potential control circuit 400 is brought to about 15.5KΩ and the combined resistance value in the bias circuit 230 becomes about 15KΩ. Since $V_a-V_b=5$ V, the current to be used up during the period $T_4$ reaches 0.164 mA.

Since a state developed during a period $T_5$ is the very same as that developed during the period $T_1$, its description will be omitted. Subsequently, the periods $T_1$ through $T_4$ are repeated in a manner similar to the first embodiment.

Now, the current used up by the drive voltage generating circuit according to the second embodiment when the potential level of each scanning electrode 11 changes from $V_4$ to $V_1$, means the average current consumed during the periods $T_1$ through $T_4$. Since the length of each of the periods $T_2$ and $T_4$ is twice the length of each of the periods $T_1$ and $T_3$, the average of current consumption (in the case where the current to be used up by the drive voltage generating circuit according to the second embodiment is at a minimum under the condition that the contrast data C1 through C5 are all "L" in level) measures about 0.273 mA.

The potential level of the signal output during the time period $T_3$ varies in analog form so as to create a gentle curve without varying in digital form like the first and second select signals CP1 and CP2 in a manner similar to the first embodiment. A period (rounding) in which the potential level varies in analog form, represents about 7.89% of the pulse width of the second select signal CP2 in a manner similar to the first embodiment.

If the current used up by the drive voltage generating circuit according to the second embodiment is calculated in the same manner as described above where the current consumed by the drive voltage generating circuit is at a maximum under the condition that the contrast data C1 through C5 are all "H" in level, then the consumed average current reaches about 0.540 mA and the rounding of each output waveform represents about 7.89% of the pulse width of the second select signal CP2.

Thus, reductions in the minimum and maximum currents consumed by the drive voltage generating circuit according to the second embodiment of the present invention respectively reach about 0.055 mA (about 16.8%) and about 0.107 mA (about 16.6%) while the rounding of each waveform remains unchanged as compared with the drive voltage generating circuit according to the first embodiment.

Further, in the drive voltage generating circuit according to the second embodiment, the ratio between the lengths of the periods $T_1$ through $T_4$ is set as $T_1:T_2:T_3:T_4=1:3:1:3$ without changing the circuit configuration of the drive voltage generating circuit according to the first embodiment to reduce the average of current consumption.

Figure 8:
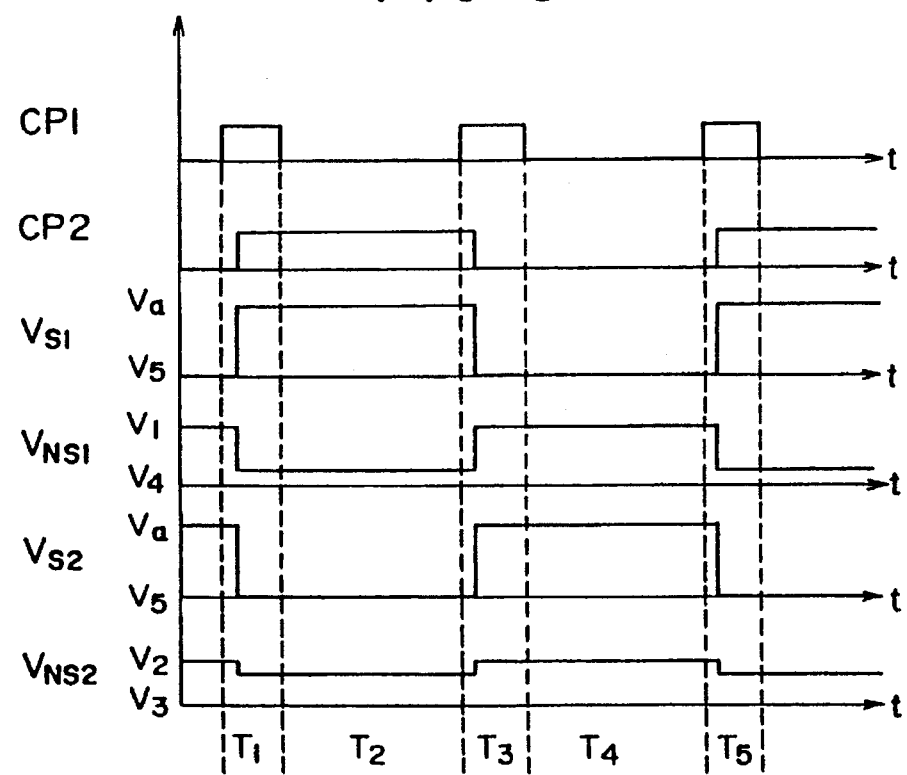
FIG. 8 is a view for describing the relationship between waveforms output from a drive voltage generating circuit according to a third embodiment of the present invention and select signal CP1 and CP2 input thereto.

FIG. 8 is a view for describing waveforms of first and second select signals CP1, CP2 and signals output from first through fourth output terminals 206 through 209 all of which are employed in a third embodiment of the present invention. The operation of the drive voltage generating circuit according to the third embodiment is identical to that of the drive voltage generating circuit according to the first embodiment, and its description will therefore be omitted.

In the drive voltage generating circuit according to the third embodiment, the minimum average of current consumption (in the case where the contrast data C1 through C5 are all "L" in level) becomes about 0.246 mA and the maximum average of current consumption (in the case where the contrast data C1 through C5 are all "H" in level) reaches about 0.486 mA. Incidentally, the rounding of each output waveform corresponds to about 7.89% of the pulse width of the second select signal CP2, which is identical to that obtained in the drive voltage generating circuit according to the first embodiment.

To reduce the current consumption, the ratio between the lengths of the periods $T_1$ through $T_4$ can be set as $T_1:T_2:T_3:T_4=1:8:1:8$ at the maximum in the same manner as will be described below. When the ratio between the lengths of the periods $T_1$ through $T_4$ is now represented as $T_1:T_2:T_3:T_4=1:8:1:8$, the minimum average of current consumption (in the case where the contrast data C1 through C5 are all "L" in level) reaches about 0.200 mA and the maximum average of current consumption (in the case where the contrast data C1 through C5 are all "H" in level) reaches about 0.397 mA. Incidentally, the rounding of each output waveform represents about 7.89% of the pulse width of the second select signal CP2, which is identical to that obtained in the drive voltage generating circuit according to the first embodiment.

In the second and third embodiments, the lengths of the periods $T_1$ through $T_4$ are changed to reduce the current consumption. However, the resistance value of each resistor may be changed to reduce the current consumption. A description will now be made of a fourth embodiment in which the resistance values of the individual resistors are changed.

A drive voltage generating circuit according to the fourth embodiment is identical in circuit configuration to the drive voltage generating circuit according to the first embodiment. Therefore, the drive voltage generating circuit according to the fourth embodiment will be described below with reference to FIG. 1.

In the drive voltage generating circuit according to the fourth embodiment, the resistance values of first resistance means 271 through 275 are respectively set to 0.8KΩ, 1.6KΩ, 3.2KΩ, 6.4KΩ and 12.8KΩ in order of the first resistance means 275 through 271. Further, the resistance values of second resistance means 301 through 305 are respectively set to 0.2KΩ, 0.4KΩ, 0.8KΩ, 1.6KΩ and 3.2KΩ in order of the second resistance means 305 through 301. Furthermore, the resistance values of third resistance means 211 through 215 are all set to the same resistance value of 5KΩ and the resistance values of fourth resistance means 251 through 255 are all set to the same resistance value of 1.25KΩ.

Incidentally, the ratio between the resistance values of the first resistance means 275 through 271 and the ratio between the resistance values of the second resistance means 301 through 305 are set in a manner similar to the first embodiment so that the former and latter resistance values are respectively doubled in order each time the respective resistance means are spaced away from the second power source potential input terminal 203. It is however unnecessary to strictly double the individual resistance values in order. Each resistance value may fall within a range of ±15% or so. Incidentally, other conditions are identical to those employed in the first embodiment.

When the drive voltage generating circuit according to the fourth embodiment, which has been set to the above conditions, is now activated under the same conditions as those applied to the drive voltage generating circuit according to the first embodiment, waveforms of first and second select signals CP1, CP2 and those of signals output from the first through fourth output terminals 202 through 209 are represented as illustrated in FIG. 5 in a manner similar to the first embodiment.

If the current used up by the drive voltage generating circuit according to the fourth embodiment is calculated in the same manner as the first embodiment on condition that the ratio between the lengths of periods $T_1$ through $T_4$ is set as $T_1:T_2:T_3:T_4=1:1:1:1$, then the minimum average of current consumption (in the case where all the contrast data C1 through C5 are "L" in level) reaches about 0.301 mA and the maximum average of current consumption (in the case where all the contrast data C1 through C5 are "H" in level) becomes about 0.581 mA. Incidentally, the rounding of each output waveform represents about 7.89% of the pulse width of the second select signal CP2, which is identical to that obtained in the drive voltage generating circuit according to the first embodiment.

To further reduce the current consumption, the ratio between the lengths of the period $T_1$ through $T_4$ can be set between $T_1:T_2:T_3:T_4=1:2:1:2$ and $T_1:T_2:T_3:T_4=1:8:1:8$. The minimum average of current consumption (in the case where the contrast data C1 through C5 are all "L" in level), the maximum average of current consumption (in the case where the contrast data C1 through C5 are all "H" in level) and the rounding of each of the output waveforms with respect to the lengths of the periods $T_1$ through $T_4$ are shown in Table 2.

TABLE 2

| AVERAGE OF CURRENT CONSUMPTION $T_1:T_2:T_3:T_4$ | FIRST TO THIRD EMBODIMENTS | | FOURTH EMBODIMENT | | FIFTH EMBODIMENT | |
| --- | --- | --- | --- | --- | --- | --- |
| | MINIMUM | MAXIMUM | MINIMUM | MAXIMUM | MINIMUM | MAXIMUM |
| 1:1:1:1 | 0.328 | 0.646 | 0.301 | 0.581 | 0.452 | 0.852 |
| 1:2:1:2 | 0.273 | 0.539 | 0.234 | 0.453 | 0.318 | 0.601 |
| 1:3:1:3 | 0.246 | 0.486 | 0.200 | 0.389 | 0.251 | 0.476 |
| 1:4:1:4 | 0.230 | 0.454 | 0.180 | 0.350 | 0.211 | 0.400 |
| 1:5:1:5 | 0.219 | 0.433 | 0.167 | 0.325 | 0.184 | 0.350 |
| 1:6:1:6 | 0.211 | 0.417 | 0.157 | 0.307 | 0.165 | 0.314 |
| 1:7:1:7 | 0.205 | 0.406 | 0.150 | 0.293 | 0.150 | 0.287 |
| 1:8:1:8 | 0.200 | 0.397 | 0.145 | 0.282 | 0.139 | 0.266 |
| 1:9:1:9 | | | | | 0.130 | 0.250 |
| ROUNDING OF WAVEFORM | 7.89% | | 7.89% | | 7.44% | |

As is understood from Table 2, the drive voltage generating circuit according to the fourth embodiment provides less current consumption as compared with the drive voltage generating circuit according to the first embodiment.

In the first through fourth embodiments, the timing to the first and second select signals CP1 and CP2 and the resistance values of the resistors employed in the individual drive voltage generating circuits were changed with attention to the current consumption. However, the rounding of each output waveform can be reduced by changing the resistance values of the resistors employed in each drive voltage generating circuit. This example will be described below as a fifth embodiment.

A drive voltage generating circuit according to the fifth embodiment is identical in circuit configuration to that according to the first embodiment. Thus, the drive voltage generating circuit according to the fifth embodiment will be described below with reference to FIG. 1.

In the drive voltage generating circuit according to the fifth embodiment, the resistance values of first resistance means 271 through 275 are respectively set to 1.6KΩ, 3.2KΩ, 6.4KΩ, 12.8KΩ and 25.6KΩ in order of the first resistance means 275 through 271. Further, the resistance values of second resistance means 301 through 305 are respectively set to 0.1KΩ, 0.2KΩ, 0.4KΩ, 0.8KΩ and 1.6KΩ in order of the second resistance means 305 through 301. Furthermore, the resistance values of third resistance means 211 through 215 are all set to the same resistance value of 10KΩ and the resistance values of fourth resistance means 251 through 255 are all set to the same resistance value of 0.625KΩ.

Incidentally, the ratio between the resistance values of the first resistance means 275 through 271 and the ratio between the resistance values of the second resistance means 301 through 305 are respectively set in a manner similar to the first embodiment so that the former and latter resistance values are respectively doubled in order each time the respective resistance means are spaced away from the second power source potential input terminal 203. It is however unnecessary to strictly double the individual resistance values in order. Each resistance value may fall within a range of ±15% or so. Incidentally, other conditions are identical to those employed in the first embodiment.

When the drive voltage generating circuit according to the fifth embodiment, which has been set to the above conditions, is now activated under the same conditions as those applied to the drive voltage generating circuit according to the first embodiment, waveforms of first and second select signals CP1, CP2 and those of signals output from first through fourth output terminals 202 through 209 are represented as illustrated in FIG. 5 in a manner similar to the first embodiment.

If the current used up by the drive voltage generating circuit according to the fifth embodiment is calculated in the same manner as the first embodiment on condition that the ratio between the lengths of periods $T_1$ through $T_4$ is represented as $T_1:T_2:T_3:T_4=1:1:1:1$, then the minimum average of current consumption (in the case where all the contrast data C1 through C5 are "L" in level) reaches about 0.452 mA and the maximum average of current consumption (in the case where all the contrast data C1 through C5 are "H" in level) reaches about 0.852 mA. If the rounding of each output waveform is measured in a manner similar to the first embodiment, then a period (rounding) in which the output waveform varies in analog form measures about 62.0 mS. This rounding is about 7.44% of the pulse width of the second select signal CP2. Thus, the current used up by the drive voltage generating circuit according to the fifth embodiment is larger than that consumed by the drive voltage generating circuit according to the first embodiment. However, the rounding of the output waveform obtained in the fifth embodiment is reduced as compared with that of the output waveform obtained in the first embodiment.

To further reduce the current consumption, the ratio between the lengths of the period $T_1$ through $T_4$ can be set between $T_1:T_2:T_3:T_4=1:2:1:2$ and $T_1:T_2:T_3:T_4=1:9:1:9$. The minimum average of current consumption (in the case where the contrast data C1 through C5 are all "L" in level), the maximum average of current consumption (in the case where the contrast data C1 through C5 are all "H" in level) and the rounding of each of the output waveforms with respect to the lengths of the periods $T_1$ through $T_4$ are shown in Table 2.

The first through fifth embodiments have described the drive voltage generating circuits each capable of performing contrast adjustments represented in 32 steps under the condition that the duty is taken as 1/16, the number of biases is taken as 1/5, a drive voltage control range falls between 2.46 V and 4.83 V and one step width is about 70 mV. On the other hand, a sixth embodiment will describe a drive voltage generating circuit employed in a liquid crystal panel having a 1/32 duty and a 1/7 bias.

Figure 9:
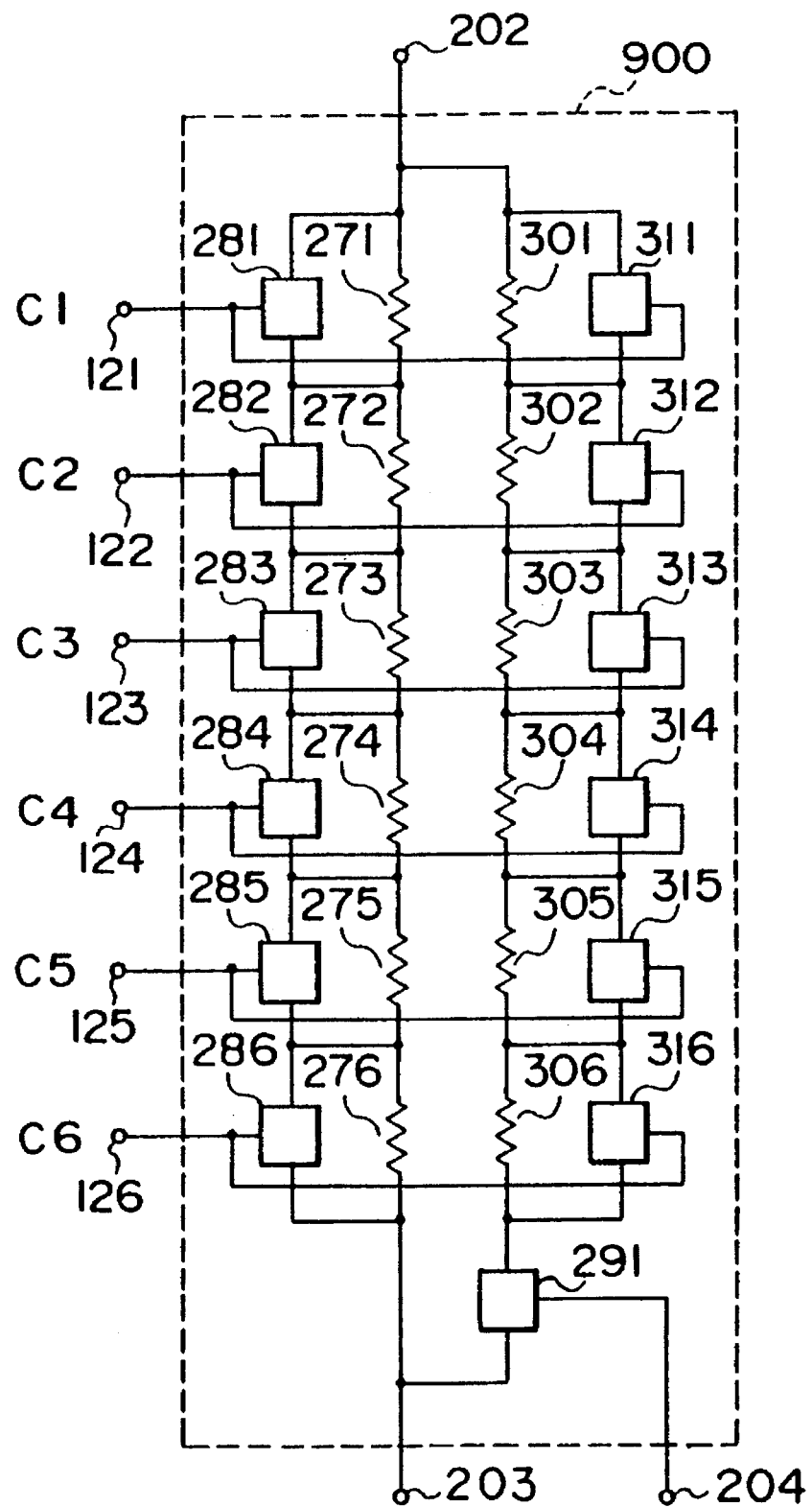
FIG. 9 is a circuit diagram showing a bias potential control circuit employed in a drive voltage generating circuit according to a sixth embodiment of the present invention.

The drive voltage generating circuit according to the sixth embodiment makes use of other bias potential control circuit 900 shown in FIG. 9 as an alternative to the bias potential control circuit 400 of the drive voltage generating circuit according to the first embodiment shown in FIG. 1. Other circuits employed in the drive voltage generating circuit according to the sixth embodiment are identical to those employed in the drive voltage generating circuit according to the first embodiment and their description will therefore be omitted. Only the bias potential control circuit 900 will be described with reference to FIG. 9.

In the bias potential control circuit 900, the number of contrast data used to adjust or control the contrast is set to 6 bits corresponding to C1 through C6. Accordingly, the bias potential control circuit 900 has a first resistance-type voltage dividing circuit comprised of a plurality of series-connected first resistance means (such as voltage-dividing resistances) 271 through 276 and a second resistance-type voltage dividing circuit comprised of a plurality of series-connected second resistance means (such as voltage-dividing resistances) 301 through 306. The first resistance-type voltage dividing circuit is electrically connected between a node 202 and a second power source potential input terminal 203. The second resistance-type voltage dividing circuit is electrically connected between the node 202 and the second power source potential input terminal 203 through a first switching circuit 291. The first switching circuit 291 has a control terminal electrically connected to a first select signal input terminal 204. The first switching circuit 291 controls conduction or non-conduction between one end of the second resistance-type voltage dividing circuit and the second power source potential input terminal 203 in response to a first select signal CP1. In the sixth embodiment, the first switching circuit 291 is made up of an NMOSFET.

Second through sixth and seventeenth switching circuits 281 through 286 are parallel-connected to their corresponding first resistance means 271 through 276. In the sixth embodiment, each of the second through sixth and seventeenth switching circuits 281 through 286 is comprised of an NMOSFET. Further, seventh through eleventh and eighteenth switching circuits 311 through 316 are electrically parallel-connected to their corresponding second resistance means 301 through 306. In the sixth embodiment, each of the seventh through eleventh and eighteenth switching circuits 311 through 316 is also comprised of an NMOSFET in the same manner as described above. Control terminals of the second and seventh switching circuits 281 and 311 are electrically common-connected to a first control signal input terminal 121. Likewise, control terminals of the third and eighth switching circuits 282 and 312 are electrically connected to a second control signal input terminal 122 in common. Control terminals of the fourth and ninth switching circuits 283 and 313 are electrically connected to a third control signal input terminal 123 in common. Control terminals of the fifth and tenth switching circuits 284 and 314 are electrically connected to a fourth control signal input terminal 124 in common. Control terminals of the sixth and twelfth switching circuits 285 and 315 are electrically connected to a fifth control signal input terminal 125. Control terminals of the seventeenth and eighteenth switching circuits 286 and 316 are electrically connected to a sixth control signal input terminal 126 in common. Accordingly, the second through sixth and seventeenth switching circuits 281 through 286 and the seventh through eleventh and eighteenth switching circuits 311 through 316 respectively short-circuit the first resistance means 271 through 276 and the second resistance means 301 through 306 in response to the first through fifth control signals C1 through C6.

In the drive voltage generating circuit according to the sixth embodiment, which has the above construction, a high power source potential $V_a$ applied to a first power source potential input terminal 201 is set to 5 V, whereas a low power source potential $V_b$ applied to a second power source potential input terminal 203 is set to 0 V. All the resistance values of third resistance means 211, 212, 214 and 215 are set to the same resistance value, i.e., 6KΩ. The resistance value of a third resistance means 213 is set to 18KΩ. Further, all the resistance values of fourth resistance means 251, 252, 254 and 255 are set to the same resistance value, i.e., 0.85KΩ. The resistance value of a fourth resistance means 253 is set to 2.55KΩ. The resistance values of the first resistance means 271 through 276 are set to 0.65KΩ, 1.3KΩ, 2.6KΩ, 5.2KΩ, 10.4KΩ and 20.8KΩ in order of the reference numerals 276 through 271. Namely, the ratio between the resistance values of the first resistance means 276 through 271 is represented as the first resistance means 276: the first resistance means 275: the first resistance means 274: the first resistance means 273: the first resistance means 272: the first resistance means 271=1:2:4:8:16:32. Likewise, the resistance values of the second resistance means are respectively set to 0.095KΩ, 0.19KΩ, 0.38KΩ, 0.76KΩ, 1.52KΩ and 3.04KΩ in such a manner that the ratio between the second resistance means 301 through 306 is represented as the second resistance means 306: the second resistance means 305: the second resistance means 304: the second resistance means 303: the second resistance means 302: the second resistance means 301=1:2:4:8:16:32.

Incidentally, the ratio between the resistance values of the first resistance means 276 through 271 and the ratio between the resistance values of the second resistance means 306 through 301 are set so that the former and latter resistance values are respectively doubled in order each time the respective resistance means are spaced away from the second power source potential input terminal 203. It is however unnecessary to strictly double each resistance value in order. Each resistance value may fall within a range of ±10% or so.

In the drive voltage generating circuit according to the sixth embodiment, which has been set in the above-described manner, a bias potential $V_5$ is adjusted based on the contrast data C1 through C6 so that contrast adjustments represented in 62 steps can be performed.

The relationship between a bias potential $V_1$ equivalent to a potential at a point where the third resistance means 211 and the third resistance means 212 are connected to each other and bias potentials $V_2$, $V_3$, $V_4$ and $V_5$ equivalent to potentials at connecting points of the third resistance means 212 through 215 will now be described. That is, if the bias potentials $V_1$ through $V_4$ are represented with the bias potential $V_5$ adjustable based on the contrast data C1 through C6 as reference, then they are expressed in the following manner. The bias potentials $V_1$ through $V_4$ are determined based on the bias potential $V_5$.

$$V_1 = 6/7(V_a - V_5)(V), V_2 = 5/7(V_a - V_5)(V), V_3 = 3/7(V_a - V_5)(V),$$

$$V_4 = 1/7(V_a - V_5)(V)$$

A control range of a drive voltage $(V_a - V_5)$ for each liquid crystal extends from 5.0 V to 10.0 V. This voltage range shows a potential or voltage level which is sufficiently applicable as a drive voltage for a liquid crystal having a ⅟₃₂ duty. The width per step, of the voltage controlled by the contrast data C1 through C6 is 80 mV. The drive voltage generating circuit according to the sixth embodiment can also effect minute control or adjustment on the contrast in a liquid crystal panel.

Figure 10:
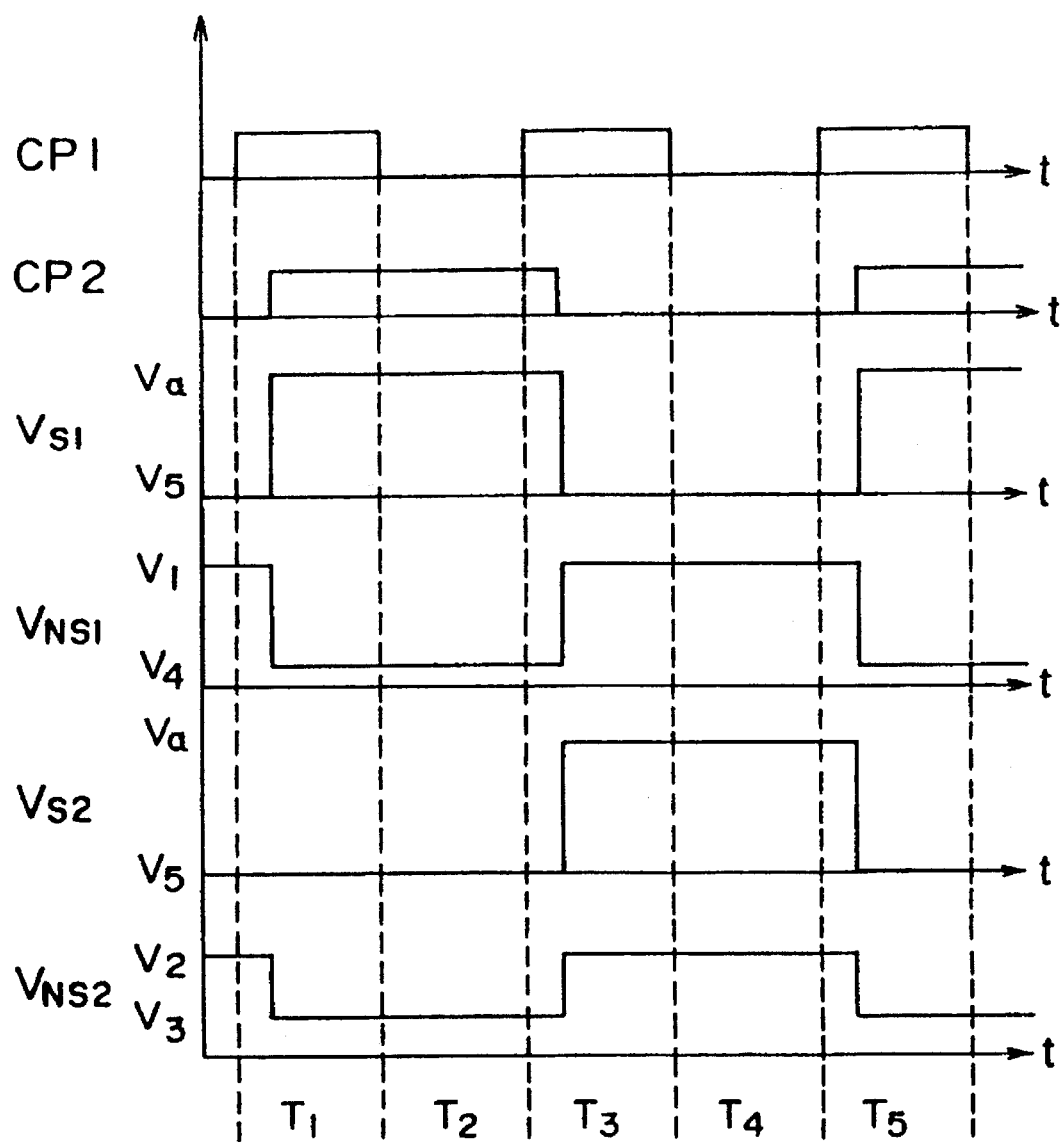
FIG. 10 is a view for describing the relationship between waveforms output from the drive voltage generating circuit shown in FIG. 9 and select signals CP1 and CP2 input thereto.

FIG. 10 is a view for describing waveforms of the select signals CP1 and CP2 respectively input from the first select signal input terminal 204 and the second select signal input terminal 205 both employed in the drive voltage generating circuit according to the sixth embodiment and waveforms of select voltages $V_{S1}$, $V_{S2}$ and non-select voltages $V_{NS1}$ and $V_{NS2}$ respectively output from output terminals 206 through 209 employed in the drive voltage generating circuit.

A description will now be made of the current used up by the drive voltage generating circuit according to the sixth embodiment and the rounding of each waveform output from the drive voltage generating circuit. In this description, all the values of the on resistances of the first through fourth electronic switches 261a through 262b employed in the drive voltage generating circuit according to the first embodiment are taken as 0.4KΩ and all the values of the on resistances of the fifth through eighth electronic switches 263a through 264b employed in the drive voltage generating circuit are taken as 1KΩ in addition to the conditions for the drive voltage generating circuit according to the sixth embodiment. The frequency of the second select signal CP2 is taken as 75 Hz.

Further, the on resistance values of the electronic switches 32a and 32b employed in the liquid crystal matrix panel drive unit shown in FIG. 2 are taken as 11.2KΩ and the on resistance values of the electronic switches 43a and 43b are taken as 75KΩ. The capacity per scanning electrode 11 is taken as 270 pF and the capacity per signal electrode 12 is taken as 140 pF. Let's also assume that the liquid crystal matrix panel drive unit has thirty-two scanning electrodes 11 and a hundred of signal electrodes 12.

Now, consider that the first and second select signal CP1 and CP2 in which all the periods $T_1$ through $T_5$ are identical to each other, are input to the drive voltage generating circuit according to the sixth embodiment as shown in FIG. 10 in addition to the above conditions.

When the current used up by the drive voltage generating circuit and the rounding of each output waveform produced therefrom are measured, the current consumed during the period $T_1$ measures 0.958 mA. The current consumed during the period $T_2$ measures 0.121 mA. During the period $T_3$, the potential level of each scanning electrode 11 changes from $V_4$ to $V_1$. The current used up during the period $T_3$ reaches 0.958 mA and the rounding of the waveform output during the period $T_3$ is about 6.89% of the pulse width of the second select signal CP2. The current consumed during the period $T_4$ becomes 0.121 mA.

Since the period $T_5$ is completely identical in operating state to the period $T_1$, its description will be omitted. Subsequently, the periods $T_1$ through $T_4$ are repeated.

Now, the current used up by the drive voltage generating circuit according to the sixth embodiment when the potential level of each scanning electrode 11 changes from $V_4$ to $V_1$, means the average of the currents consumed during the periods $T_1$ through $T_4$. Since the periods $T_1$ through $T_4$ are identical in length to each other as described above, the average of current consumption reaches about 0.540 mA obtained from the simple averaging process.

Incidentally, the above description has been made of the case where the current consumed by the drive voltage generating circuit according to the sixth embodiment is at a minimum under the condition that the contrast data C1 through C5 are all "L" in level. If, on the other hand, the current used up by the drive voltage generating circuit according to the sixth embodiment is calculated in the same manner as described above where the current consumed by the drive voltage generating circuit is at a maximum under the condition that the contrast data C1 through C5 are all "H" in level, then the average of current consumption reaches about 1.048 mA.

In the drive voltage generating circuit according to the sixth embodiment, the ratio between the lengths of the periods $T_1$ through $T_4$ can be set to $T_1:T_2:T_3:T_4=1:9:1:9$ at a maximum in a manner similar to the second through fifth embodiments in order to reduce the current consumption. When the ratio between the lengths of the periods $T_1$ through $T_4$ is now taken as $T_1:T_2:T_3:T_4=1:9:1:9$, the minimum average of current consumption (in the case where the contrast data C1 through C5 are all "L" in level) measures about 0.205 mA and the maximum average of current consumption (in the case where the contrast data C1 through C5 are all "H" in level) measures about 0.402 mA. Incidentally, the rounding of each output waveform represents about 6.89% of the pulse width of the second select signal CP2.

Figure 11:
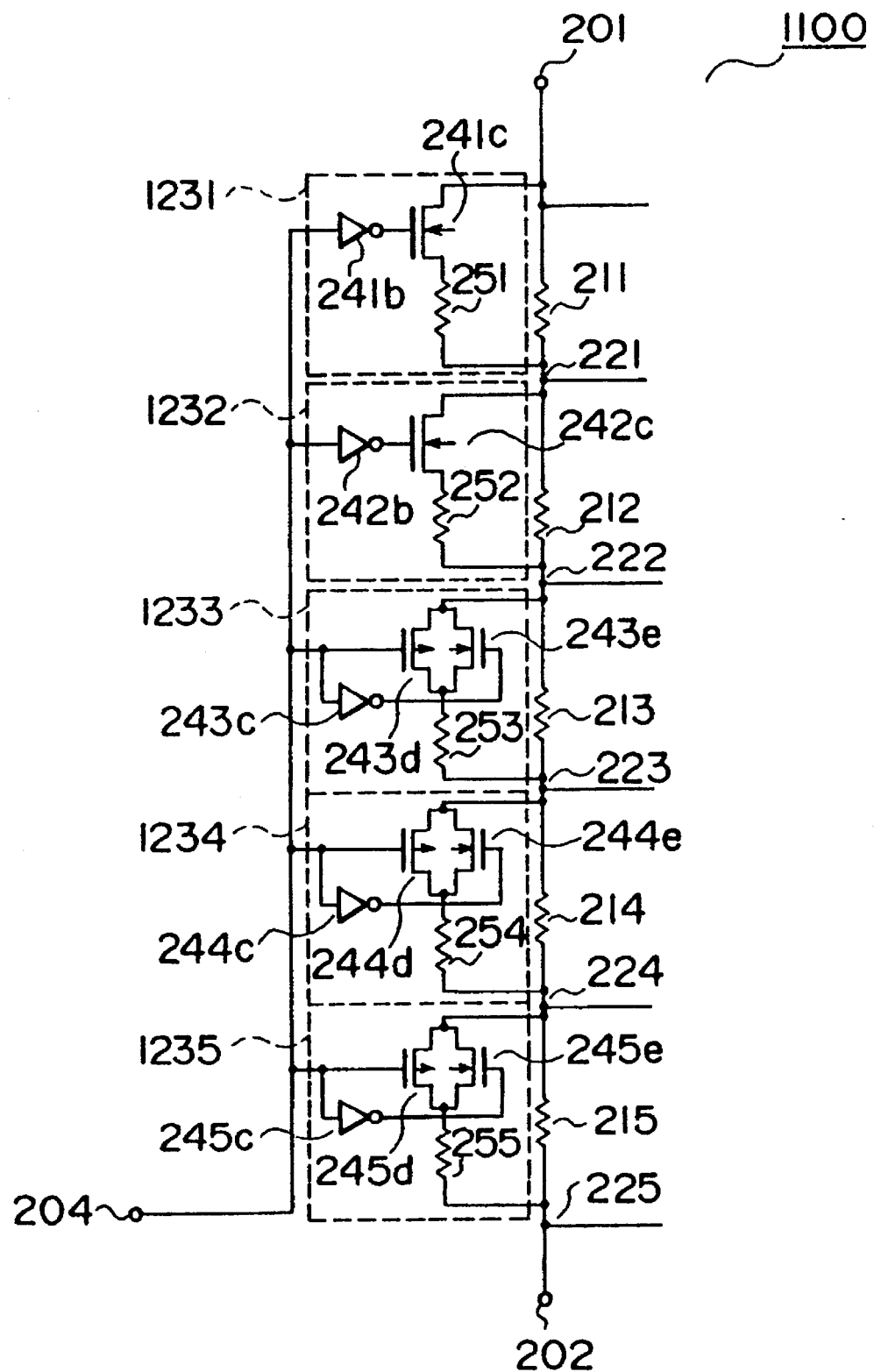
FIG. 11 is a circuit diagram showing a bias circuit employed in a drive voltage generating circuit according to a seventh embodiment of the present invention.
Figure 12:
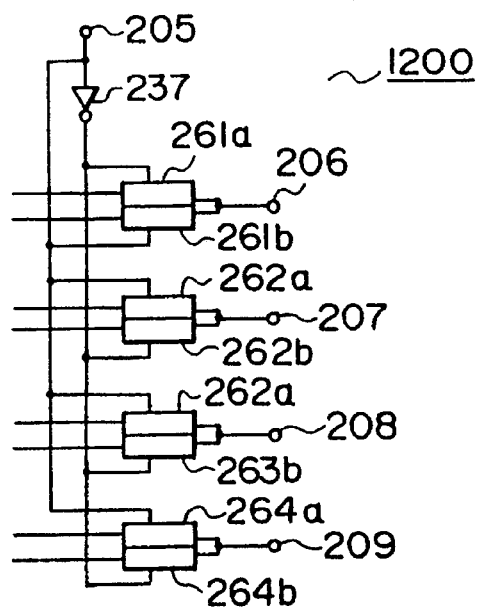
FIG. 12 is a circuit diagram illustrating an electronic switching circuit used in the drive voltage generating circuit shown in FIG. 11.

A description will now be made of a drive voltage generating circuit according to a seventh embodiment of the present invention. In the drive voltage generating circuit according to the present embodiment, another bias circuit 1100 shown in FIG. 11 is used as an alternative to the bias circuit 230 of the drive voltage generating circuit according to the first embodiment shown in FIG. 1 and another electronic switching circuit 1200 shown in FIG. 12 is used as an alternative to the electronic switching circuit 260. Further, each of first through eleventh switching circuits 291, 281 through 285 and 301 through 305 is comprised of a PMOSFET.

The circuit configuration of the bias circuit 1100 employed in the drive voltage generating circuit according to the seventh embodiment will now be described with reference to FIG. 11. Incidentally, the same elements of structure as those employed in the bias circuit 230 shown in FIG. 3 are identified by the same reference numerals and their description will therefore be omitted.

The bias circuit 1100 comprises third resistance means 211 through 215 and bias resistance variable circuits 1231 through 1235 parallel-connected to their corresponding third resistance means 211 through 215. The bias resistance variable circuits 1231 and 1232 are respectively comprised of NMOSFETs 241c and 242c, fourth resistance means 251 and 252 respectively series-connected to the NMOSFETs 241c and 242c and inverters 241b and 242b respectively series-connected thereto. The inverters 241b and 242b are respectively electrically connected between the gates of the PMOSFETs 241c and 242c and a first select signal input terminal 204. The bias resistance variable circuits 1233 through 1235 are respectively made up of fourth resistance means 253 through 255, PMOSFETs 243d through 245d, NMOSFETs 243e through 245e and inverters 243c through 245c. The PMOSFETs 243d through 245d and the NMOSFETs 243e through 245e are respectively electrically parallel-connected to one another so as to form analog switches. The analog switches are respectively electrically connected in series with the fourth resistance means 251 through 255. The gates of the NMOSFETs 243e through 245e are respectively electrically connected to the first select signal input terminal 204 through the inverters 243c through 245c in common with the gates of the PMOSFETs 243d through 245d.

The circuit configuration of the electronic switching circuit 1200 employed in the drive voltage generating circuit according to the seventh embodiment will now be described with reference to FIG. 12. Incidentally, the same elements of structure as those used in the electronic switching circuit 260 are identified by like reference numerals and their description will therefore be omitted.

The electronic switching circuit 260 comprises an inverter 237 electrically connected to a second select signal input terminal 205, a first electronic switch 261a whose input, output and control input are respectively connected to a first power source potential input terminal 201, a first output terminal 206 and the output of an inverter 237, a second electronic switch 261b whose input, output and control input are respectively connected to a fifth output 225 of a bias circuit 230, the first output terminal 206 and the second select signal input terminal 205, a third electronic switch 262a whose input, output and control input are respectively connected to a first output 221 of the bias circuit 230, a second output terminal 207 and the second select signal input terminal 205, a fourth electronic switch 262b whose input, output and control input are respectively connected to a fourth output 224 of the bias circuit 230, a second output terminal 207 and the output of the inverter 237, a fifth electronic switch 263a whose input, output and control input are respectively connected to a second output 222 of the bias circuit 230, a third output terminal 208 and the second select signal input terminal 205, a sixth electronic switch 263b whose input, output and control input are respectively connected to a third output 223 of the bias circuit 230, the third output terminal 208 and the output of the inverter 237, a seventh electronic switch 264a whose input, output and control input are respectively electrically connected to the first power source potential input terminal 201, a fourth output terminal 209 and the second select signal input terminal 205, and an eighth electronic switch 263b whose input, output and control input are respectively electrically connected to the fifth output 225 of the bias circuit 230, the fourth output terminal 209 and the output of the inverter 237.

A low power source potential $V_b$ and a high power source potential $V_a$ are respectively applied to the first power source potential input terminal 201 and a second power source potential input terminal 203 both employed in the drive voltage generating circuit according to the seventh embodiment, which has been constructed as described above. Incidentally, circuits used in the drive voltage generating circuit according to the seventh embodiment, which are other than the aforementioned circuits, are identical to those employed in the drive voltage generating circuit according to the first embodiment.

Figure 13:
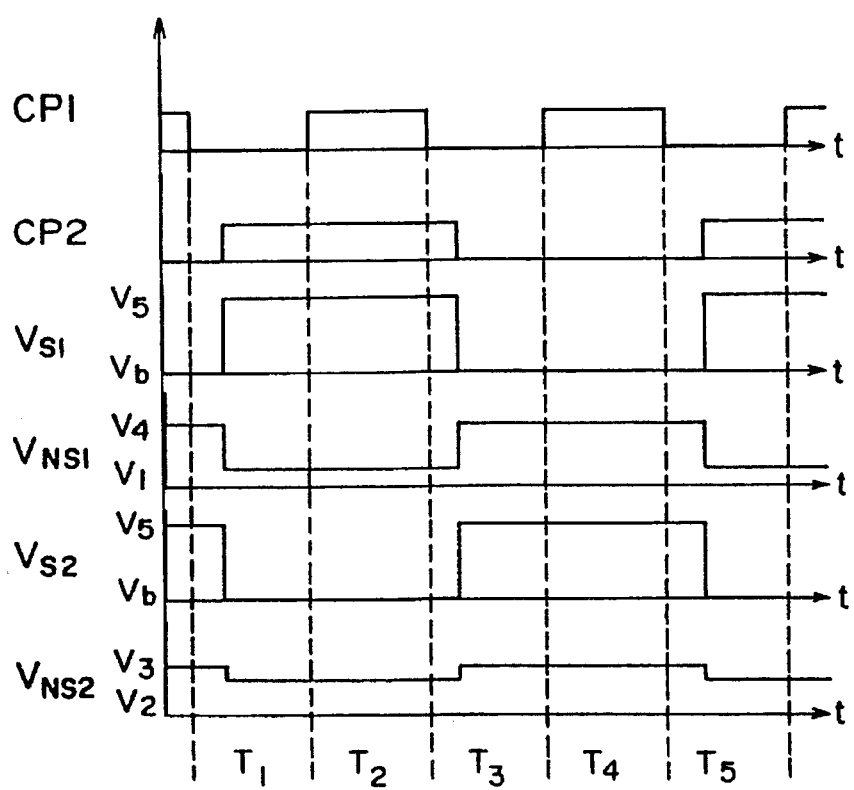
FIG. 13 is a view for describing the relationship between waveforms output from the drive voltage generating circuit shown in FIG. 11 and select signals CP1 and CP2 input thereto.

FIG. 13 is a view for describing waveforms of select signals CP1 and CP2 respectively input from the first select signal input terminal 204 and the second select signal input terminal 205 both employed in the drive voltage generating circuit according to the seventh embodiment and waveforms of select voltages $V_{S1}$, $V_{S2}$ and non-select voltages $V_{NS1}$ and $V_{NS2}$ respectively output from the output terminals 206 through 209 employed in the drive voltage generating circuit.

When all the contrast data C1 through C5 output to their corresponding control signal input terminal 221 through 225 of the drive voltage generating circuit according to the seventh embodiment from an unillustrated contrast data generating circuit are "L" in level, the second through sixth switching circuits 281 through 285 and the seventh through eleventh switching circuits 311 through 315 are all turned on. Therefore, both ends of each of the first resistance means 271 through 275 and both ends of each of the second resistance means 301 through 305 are short-circuited. Namely, quite contrary to the first embodiment, a liquid crystal drive voltage ($V_5$-$V_b$) reaches a maximum voltage of about 5.0 V when the contrast data code is of "00". Further, when the contrast data code is of "1F", the liquid crystal drive voltage ($V_5$-$V_b$) reaches a minimum voltage of about 2.46 V.

Further, the relationship between the individual potentials $V_a$, $V_b$ and $V_1$ through $V_5$ is represented as $V_b<V_1<V_2<V_3<V_4<V_5\leq V_a$ on the contrary to the first embodiment. When each liquid crystal has a ⅕ duty, the levels of $V_1$ through $V_4$ are represented as follows:

$$V_1=\tfrac{1}{5}(V_5-V_b)(V), V_2=\tfrac{2}{5}(V_5-V_b)(V), V_3=\tfrac{3}{5}(V_5-V_b)(V),$$

$$V_4=\tfrac{4}{5}(V_5-V_b)(V)$$

When the drive voltage generating circuit according to the seventh embodiment, which has been set to the above conditions, is now activated on condition that other conditions are identical to those applied to the drive voltage generating circuit according to the first embodiment, the waveforms of the first and second select signals CP1, CP2 and those of signals output from the first through fourth output terminals 202 through 209 are represented as illustrated in FIG. 13.

The drive voltage generating circuit according to the seventh embodiment can bring about an advantageous effect that the minimum average of current consumption, the maximum average of current consumption and the rounding of each output waveform in the drive voltage generating circuit are substantially identical to those obtained in the first embodiment.

A description will further be made of a drive voltage generating circuit according to an eighth embodiment of the present invention. In the drive voltage generating circuit according to the eighth embodiment, the first through eleventh switching circuits 291, 281 through 285 and 311 through 315 employed in the drive voltage generating circuit according to the first embodiment shown in FIG. 1 are comprised of analog switches which are made up of NMOSFETs and PMOSFETs and perform the same operations as those of the NMOSFETs.

The drive voltage generating circuit according to the eighth embodiment can bring about an advantageous effect that the minimum average of current consumption, the maximum average of current consumption and the rounding of each output waveform in the drive voltage generating circuit are substantially identical to those obtained in the first embodiment.

A description will now be made of a drive voltage generating circuit according to a ninth embodiment. In the present drive voltage generating circuit, another bias potential control circuit 1400 shown in FIG. 14 is used as an alternative to the bias potential control circuit 400 of the drive voltage generating circuit according to the first embodiment, which is illustrated in FIG. 1.

Figure 14:
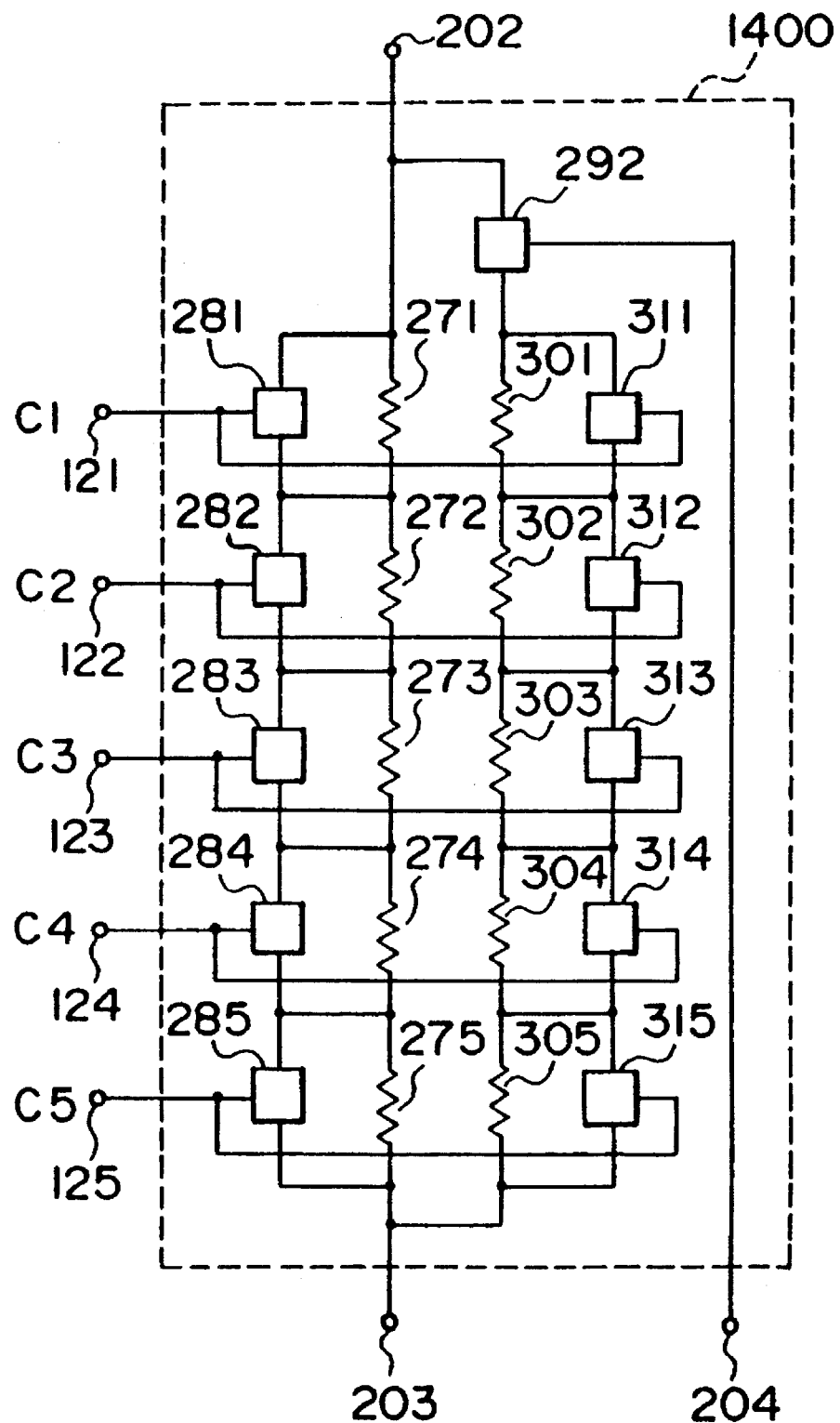
FIG. 14 is a circuit diagram showing a bias potential control circuit employed in a drive voltage generating circuit according to a ninth embodiment of the present invention.

FIG. 14 illustrates the bias potential control circuit 1400 employed in the drive voltage generating circuit according to the ninth embodiment. The bias potential control circuit 1400 has a first resistance-type voltage dividing circuit comprised of a plurality of series-connected first resistance means (such as voltage-dividing resistances) 271 through 275 and a second resistance-type voltage dividing circuit comprised of a plurality of series-connected second resistance means (such as voltage-dividing resistances) 301 through 305. The first resistance-type voltage dividing circuit is electrically connected between a node 202 and a second power source potential input terminal 203. The second resistance-type voltage dividing circuit is electrically connected between the node 202 and the second power source potential input terminal 203 through a nineteenth switching circuit 292. The nineteenth switching circuit 292 has a control terminal, one of electrodes and the other thereof respectively electrically connected to a first select signal input terminal 204, the node 202 and the second resistance-type voltage dividing circuit. The nineteenth switching circuit 292 controls conduction or non-conduction between one end of the second resistance-type voltage dividing circuit and the second power source potential input terminal 203 in response to a first select signal CP1. In the ninth embodiment, the nineteenth switching circuit 292 is made up of an NMOSFET.

Second through sixth switching circuits 281 through 285 are parallel-connected to their corresponding first resistance means 271 through 275. In the ninth embodiment, each of the second through sixth switching circuits 281 through 285 is comprised of an NMOSFET. Further, seventh through eleventh switching circuits 311 through 315 are electrically parallel-connected to their corresponding second resistance means 301 through 305. In the ninth embodiment, each of the seventh through eleventh switching circuits 311 through 315 is also comprised of an NMOSFET in the same manner as described above. Control terminals of the second and seventh switching circuits 281 and 311 are electrically common-connected to a first control signal input terminal 121. Likewise, control terminals of the third and eighth switching circuits 282 and 312 are electrically connected to a second control signal input terminal 122 in common. Control terminals of the fourth and ninth switching circuits 283 and 313 are electrically connected to a third control signal input terminal 123 in common. Control terminals of the fifth and tenth switching circuits 284 and 314 are electrically connected to a fourth control signal input terminal 124 in common. Control terminals of the sixth and twelfth switching circuits 285 and 315 are electrically connected to a fifth control signal input terminal 125. Accordingly, the second through sixth switching circuits 281 through 285 and the seventh through eleventh switching circuits 311 through 315 respectively short-circuit the first resistance means 271 through 275 and the second resistance means 301 through 305 in response to the first through fifth control signals C1 through C5.

The drive voltage generating circuit according to the ninth embodiment can bring about an advantageous effect that the minimum average of current consumption, the maximum average of current consumption and the rounding of each output waveform in the drive voltage generating circuit are substantially identical to those obtained in the first embodiment.

A description will now be made of a drive voltage generating circuit according to a tenth embodiment of the present invention. In the present drive voltage generating circuit, another bias potential control circuit 1400 shown in FIG. 14 is used as an alternative to the bias potential control circuit 400 of the drive voltage generating circuit according to the seventh embodiment.

The drive voltage generating circuit according to the tenth embodiment can bring about an advantageous effect that the minimum average of current consumption, the maximum average of current consumption and the rounding of each output waveform in the drive voltage generating circuit are substantially identical to those obtained in the seventh embodiment.

A description will now be made of a drive voltage generating circuit according to an eleventh embodiment of the present invention. In the drive voltage generating circuit according to the eleventh embodiment, the second through eleventh and nineteenth switching circuits 281 through 285, 311 through 315 and 292 employed in the bias potential control circuit 1400 of the drive voltage generating circuit according to the ninth embodiment are comprised of analog switches which are made up of NMOSFETs and PMOSFETs and perform the same operations as those of the NMOSFETs.

The drive voltage generating circuit according to the eleventh embodiment can bring about an advantageous effect that the minimum average of current consumption, the maximum average of current consumption and the rounding of each output waveform in the drive voltage generating circuit are substantially identical to those obtained in the ninth embodiment.

A description will now be made of a drive voltage generating circuit according to a twelfth embodiment. In the present drive voltage generating circuit, another bias potential control circuit 1500 shown in FIG. 15 is used as an alternative to the bias potential control circuit 400 of the drive voltage generating circuit according to the first embodiment, which is illustrated in FIG. 1.

Figure 15:
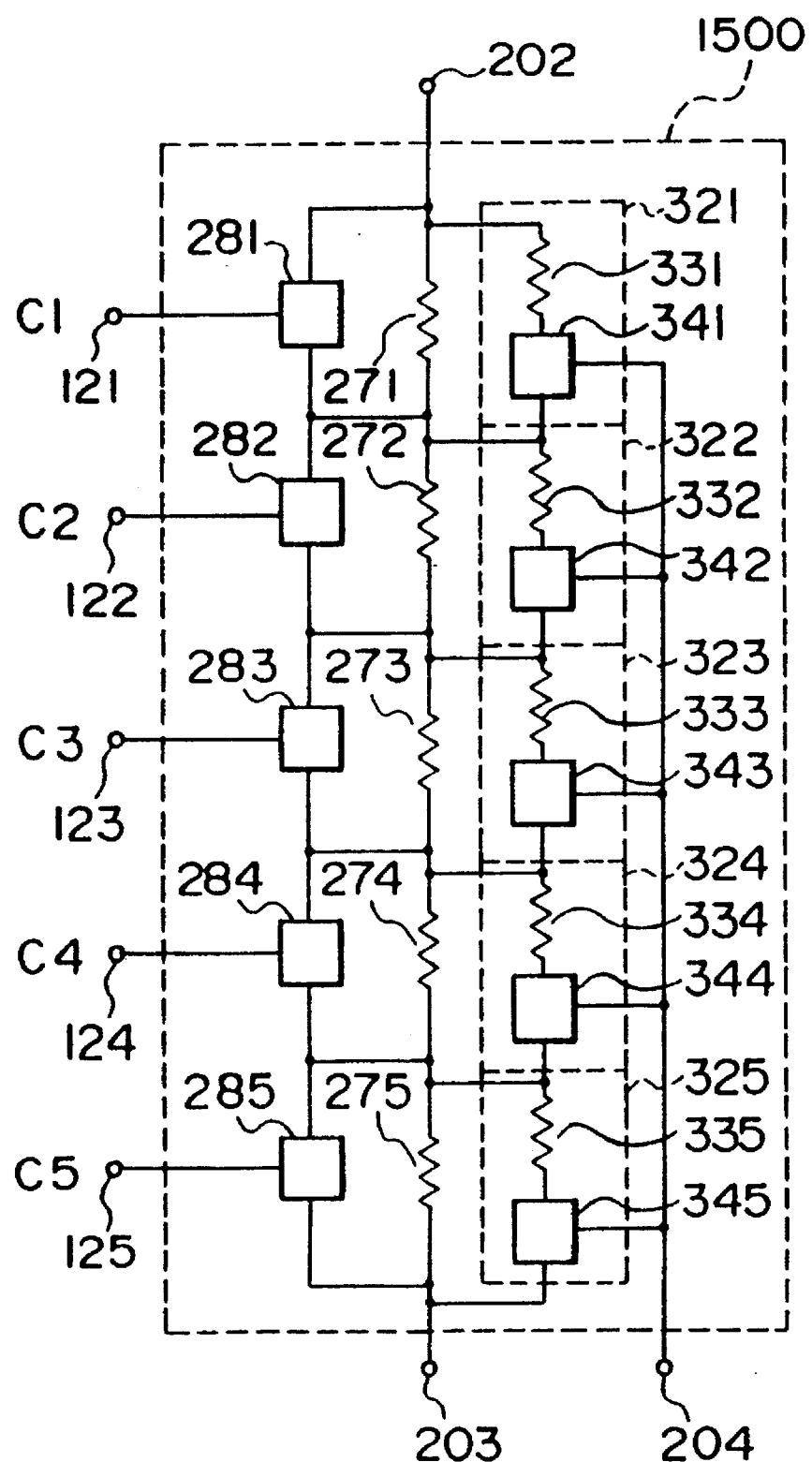
FIG. 15 is a circuit diagram illustrating a bias potential control circuit employed in a drive voltage generating circuit according to a twelfth embodiment of the present invention.

FIG. 15 illustrates the bias potential control circuit 1500 employed in the drive voltage generating circuit according to the twelfth embodiment. The bias potential control circuit 1500 has a first resistance-type voltage dividing circuit comprised of a plurality of series-connected first resistance means (such as voltage-dividing resistances) 271 through 275 and sixth through tenth adjusting resistance variable circuits 321 through 325 electrically parallel-connected to their corresponding first resistance means 271 through 275. The first resistance-type voltage dividing circuit is electrically connected between a node 202 and a second power source potential input terminal 203. The sixth through tenth adjusting resistance variable circuits 321 through 325 respectively have fifth resistance means 331 through 335 and twentieth through twenty-fourth switching circuits 341 through 345 which are respectively electrically series-connected to the fifth resistance means 331 through 335 and whose control terminals are respectively electrically connected to a first control signal input terminal 204. In the twelfth embodiment, the twentieth through twenty-fourth switching circuits 341 through 345 are comprised of NMOSFETs.

Second through sixth switching circuits 281 through 285 are respectively electrically connected in parallel with the first resistance means 271 through 275. In the twelfth embodiment, the second through sixth switching circuits 281 through 285 are respectively comprised of NMOSFETs. A control terminal of the second switching circuit 281 is electrically connected to a first control signal input terminal 121. A control terminal of the third switching circuit 282 is electrically connected to a second control signal input terminal 122. A control terminal of the fourth switching circuit 283 is electrically connected to a third control signal input terminal 123. A control terminal of the fifth switching circuit 284 is electrically connected to a fourth control signal input terminal 124. A control terminal of the sixth switching circuit 285 is electrically connected to a fifth control signal input terminal 125. Accordingly, the second through sixth switching circuits 281 through 285 respectively short-circuit the first resistance means 271 through 275 in response to first through fifth control signals C1 through C5.

The drive voltage generating circuit according to the twelfth embodiment can bring about an advantageous effect that the minimum average of current consumption, the maximum average of current consumption and the rounding of each output waveform in the drive voltage generating circuit are substantially identical to those obtained in the first embodiment.

A description will now be made of a drive voltage generating circuit according to a thirteenth embodiment. In the present drive voltage generating circuit, the other bias potential control circuit 1500 shown in FIG. 15 is used as an alternative to the bias potential control circuit 400 of the drive voltage generating circuit according to the seventh embodiment.

The drive voltage generating circuit according to the thirteenth embodiment can bring about an advantageous effect that the minimum average of current consumption, the maximum average of current consumption and the rounding of each output waveform in the drive voltage generating circuit are substantially identical to those obtained in the seventh embodiment.

Figure 16:
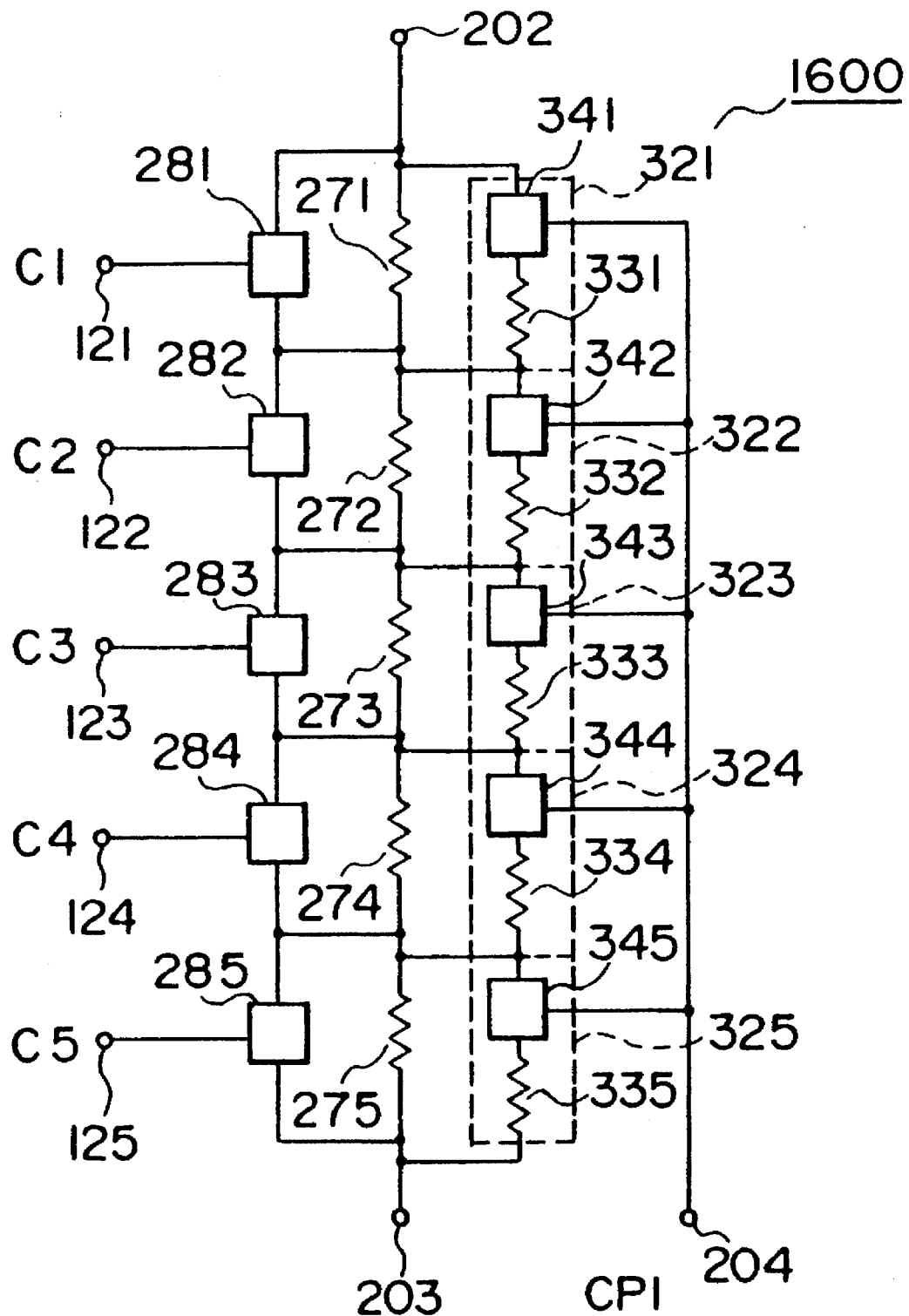
FIG. 16 is a circuit diagram depicting a bias potential control circuit applied to another construction of the present invention.
Figure 17:
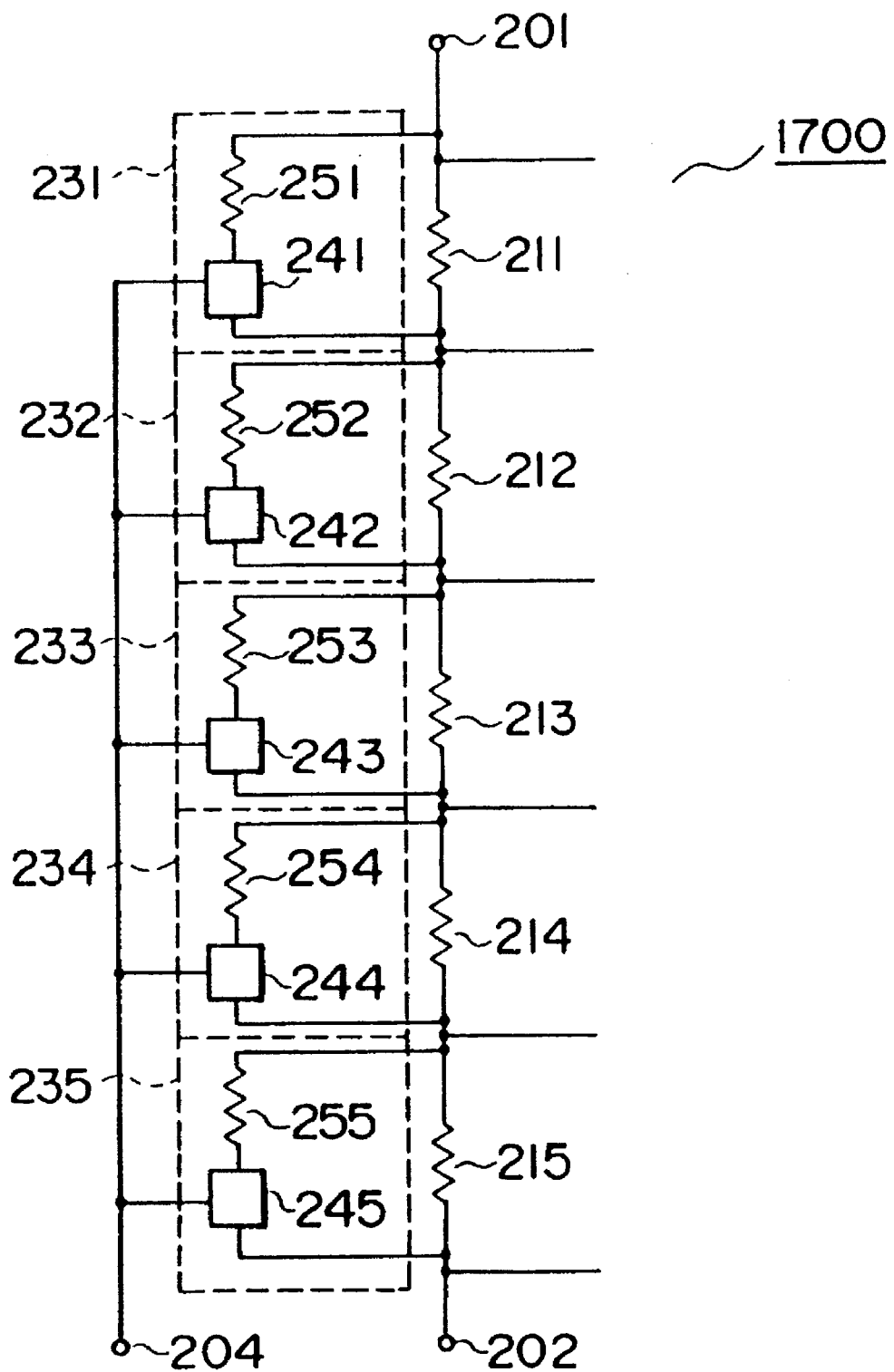
FIG. 17 is a circuit diagram showing a bias potential control circuit applied to a further construction of the present invention.

Incidentally, the present invention is not necessarily limited to the above embodiments and various modification can be made. As a bias potential control circuit, a bias potential control circuit 1600 shown in FIG. 16, for example, may be used which is an illustrative example in which the fifth resistance means 331 through 335 of the bias potential control circuit 1500 shown in FIG. 15 are respectively electrically connected to the twentieth through twenty-fourth switching circuits 341 through 345 in reverse order. Alternatively, a bias circuit 1700 shown in FIG. 17 may also be used which is an illustrative example in which the fourth resistance means 251 through 255 of the first through fifth bias resistance variable circuits 231 through 235 in the bias circuit 230 are respectively electrically connected to the twelfth through sixteenth switching circuits 241 through 245 in reverse order.

Further, output waveforms shown in FIG. 18 can also be obtained by simultaneously varying first and second select signals CP1 and CP2.

Having now fully described the invention, it will be apparent to those skilled in the art that many changes and modifications can be made without departing from the spirit or scope of the invention as set forth herein.

What is claimed is:

1. A drive voltage generating circuit comprising:

a plurality of drive output terminals for outputting drive signals having a plurality of drive voltage levels respectively;

a bias circuit having a first voltage terminal to be applied to a first voltage and a second voltage terminal to be applied to a second voltage, said bias circuit producing a plurality of voltage signals having the drive voltage levels respectively;

a switching circuit having a plurality of input terminals coupled to said bias circuit, a plurality of output terminals coupled to said drive output terminals and a control terminal which receives a first control signal; and a bias potential control circuit coupled between the second voltage terminal and a third voltage terminal to be applied to a third voltage, said bias potential control circuit including, a first voltage control circuit controlling a resistance value between the second and third voltage terminals in response to a plurality of contrast data signals, and a second voltage control circuit controlling the resistance value between the second and third voltage terminals in response to a second control signal.

2. A drive voltage generating circuit according to claim 1, wherein said bias circuit further includes a third voltage control circuit controlling a resistance value between the first and second voltage terminals thereof in response to the second control signal.

3. A drive voltage generating circuit according to claim 1, wherein said switching circuit includes a plurality of MOS transistors each of which has a gate coupled to the control terminal of said switching circuit, a first terminal coupled to one of said drive output terminals and a second terminal coupled to receive one of the voltage signals.

4. A drive voltage generating circuit according to claim 1, wherein said bias circuit includes a plurality of resistive elements serially coupled between the first and second voltage terminals thereof.

5. A drive voltage generating circuit according to claim 4, wherein said bias circuit further includes a third voltage control circuit controlling a resistance value between the first and second voltage terminals thereof in response to the second control signal.

6. A drive voltage generating circuit according to claim 5, wherein the third voltage control circuit includes a plurality of resistive circuits each of which is coupled to one of the resistive elements of said bias circuit in parallel.

7. A drive voltage generating circuit according to claim 6, wherein each of the resistive elements includes a MOS transistor having a gate coupled to receive the second control signal and a resistor serially coupled to the MOS transistor.

8. A drive voltage generating circuit according to claim 1, wherein the first voltage control circuit of said bias potential control circuit includes, a plurality of resistors serially coupled between the second and third voltage terminals, and a plurality of short circuits each of which is coupled to one of the resistors thereof in parallel, each short circuits electrically connecting therethrough in response to one of the contrast data signals received thereto.

9. A drive voltage generating circuit according to claim 1, wherein the second voltage control circuit of said bias potential control circuit includes a plurality of resistive circuits each of which is coupled to one of the resistive elements of said bias circuit in parallel in response to the second control signal received thereto.

10. A drive voltage generating circuit according to claim 1, wherein the second voltage control circuit of said bias potential control circuit includes, a plurality of resistors and a switching circuit which are serially coupled between the second and third voltage terminals, the switching circuit electrically connecting therethrough in response to the second control signal received thereto, and a plurality of short circuits each of which is coupled to one of the resistors in parallel, each short circuits electrically connecting therethrough in response to one of the contrast data signals received thereto.

11. A drive voltage generating circuit comprising:

a bias circuit having a first voltage terminal to be applied to a first voltage and a second voltage terminal to be applied to a second voltage, said bias circuit producing a plurality of voltage signals each of which has one of a plurality of drive voltage levels;

a plurality of drive output terminals for outputting drive signals each of which has either one of the drive voltage levels or another drive voltage level;

a switching circuit having a plurality of input terminals coupled to receive the voltage signals, a plurality of output terminals coupled to said drive output terminals and a control terminal receiving a first control signal; and a bias potential control circuit coupled between the second voltage terminal and a third voltage terminal to be applied to a third voltage, said bias potential control circuit including, a first voltage control circuit controlling a resistance value between the second and third voltage terminals in response to a plurality of contrast data signals received thereto, and a second voltage control circuit controlling the resistance value between the second and third voltage terminals in response to a second control signal received thereto.

12. A drive voltage generating circuit according to claim 11, wherein said bias circuit further includes a third voltage control circuit controlling a resistance value between the first and second voltage terminals thereof in response to the second control signal received thereto.

13. A drive voltage generating circuit according to claim 12, wherein said bias circuit includes a plurality of resistive elements serially coupled between the first and second voltage terminals thereof and wherein the third voltage control circuit includes a plurality of resistive circuits each of which is coupled to one of the resistive elements of said bias circuit in parallel in response to the second control signal received thereto.

14. A drive voltage generating circuit according to claim 11, wherein the first voltage control circuit of said bias potential control circuit includes, a plurality of resistors serially coupled between the second and third voltage terminals, and a plurality of short circuits each of which is coupled to one of the resistors thereof in parallel, each short circuits electrically connecting therethrough in response to one of the contrast data signals received thereto.

15. A drive voltage generating circuit according to claim 11, wherein the second voltage control circuit of said bias potential control circuit includes a plurality of resistors and a switching circuit which are serially coupled between the second and third voltage terminals, the switching circuit electrically connecting therethrough in response to the second control signal received thereto.

16. A drive voltage generating circuit according to claim 15, wherein the second voltage control circuit of said bias potential control circuit further includes a plurality of short circuits each of which is coupled to one of the resistors in parallel, each short circuits electrically connecting therethrough in response to one of the contrast data signals received thereto.

17. A drive voltage generating circuit comprising:

a plurality of drive output terminals outputting drive signals having a plurality of drive voltage levels respectively;

a bias circuit having a first voltage terminal to be applied to a first voltage level and a second voltage level terminal to be applied to a second voltage, said bias circuit producing the drive voltage levels;

a bias voltage control circuit controlling the resistance value between the first and second voltage terminals in response to a second control signal;

a switching circuit having a plurality of input terminals applied to the drive voltage levels respectively, a plurality of output terminals coupled to said drive output terminals and a control terminal which receives a first control signal; and a bias potential control circuit coupled between the second voltage terminal of said bias circuit and a third voltage terminal to be applied to a third voltage level, said bias potential control circuit controlling a resistance value between the second voltage terminal of said bias circuit and the third voltage terminal in response to a plurality of contrast data signals.

18. A drive voltage generating circuit according to claim 17, wherein said bias voltage control circuit includes a plurality of resistive circuits and a switch serially coupled between the first and second voltage terminals, the switch electrically conducting therethrough in response to the second control signal.

19. A drive voltage generating circuit according to claim 17, wherein said bias potential control circuit includes, a plurality of resistors serially coupled between the second and third voltage terminals, and a plurality of short circuits each of which is coupled to one of the resistors thereof in parallel, each short circuits electrically conducting therethrough in response to one of the contrast data signals received thereto.

20. A drive voltage generating circuit according to claim 17, wherein said bias potential control circuit further includes a voltage control circuit controlling the resistance value between the second and third voltage terminals in response to a second control signal received thereto.

21. A liquid crystal matrix panel device comprising:

a liquid crystal panel having a plurality of scanning electrodes and a plurality of signal electrodes;

a scanning circuit generating a plurality of scanning signals;

a data signal generating circuit for generating a plurality of data signals;

a first electronic switching circuit coupled to said scanning circuit and the scanning electrodes for providing a drive voltages to the scanning electrodes in response the scanning signals;

a second electronic switching circuit coupled to said data signal generating circuit and the signal electrodes for providing the drive voltages to the signal electrodes in response the data signals; and a drive voltage generating circuit comprising, a plurality of drive output terminals coupled to the first and second electronic switching circuits for applying drive voltages to the first and second electronic switching circuits;

a bias circuit having a first voltage terminal to be applied to a first voltage and a second voltage terminal to be applied to a second voltage, said bias circuit producing a plurality of voltage signals having the drive voltage levels respectively, a switching circuit having a plurality of input terminals coupled to said bias circuit, a plurality of output terminals coupled to said drive output terminals and a control terminal which receives a first control signal, and a bias potential control circuit coupled between the second voltage terminal and a third voltage terminal to be applied to a third voltage, said bias potential control circuit including a first voltage control circuit controlling a resistance value between the second and third voltage terminals in response to a plurality of contrast data signals and a second voltage control circuit controlling the resistance value between the second and third voltage terminals in response to a second control signal.

22. A liquid crystal matrix panel device according to claim 21, wherein the bias circuit further includes a third voltage control circuit controlling a resistance value between the first and second voltage terminals thereof in response to the second control signal.

* * * * *